US007605416B2

(12) United States Patent
Hong et al.

(10) Patent No.: US 7,605,416 B2
(45) Date of Patent: Oct. 20, 2009

(54) THIN FILM TRANSLATOR ARRAY PANEL AND A METHOD FOR MANUFACTURING THE PANEL

(75) Inventors: Mun-Pyo Hong, Seongnam (KR); Nam-Seok Roh, Seongham (KR); Hee-Hwan Choe, Incheon (KR); Keun-Kyu Song, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/531,442

(22) PCT Filed: Jan. 23, 2003

(86) PCT No.: PCT/KR03/00146

§ 371 (c)(1),
(2), (4) Date: Mar. 1, 2006

(87) PCT Pub. No.: WO2004/036303

PCT Pub. Date: Apr. 29, 2004

(65) Prior Publication Data

US 2006/0194368 A1    Aug. 31, 2006

(30) Foreign Application Priority Data

Oct. 14, 2002  (KR) ..................... 10-2002-0062409

(51) Int. Cl.
*H01L 31/062* (2006.01)
*G02F 1/136* (2006.01)
*G02F 1/1343* (2006.01)

(52) U.S. Cl. ............... 257/293; 257/444; 257/E27.141; 257/E29.147; 349/43; 349/152

(58) Field of Classification Search .................. 257/293, 257/444, E27.141; 349/43
See application file for complete search history.

(56) References Cited

U.S. PATENT DOCUMENTS

| 4,862,237 A * | 8/1989 | Morozumi .................. 257/72 |
| 6,091,466 A * | 7/2000 | Kim et al. ...................... 349/43 |
| 6,335,211 B1 | 1/2002 | Lee .............................. 438/22 |
| 6,624,871 B1 * | 9/2003 | Kim ........................... 349/192 |
| 6,825,125 B2 * | 11/2004 | Hiromasu et al. ........... 438/706 |

FOREIGN PATENT DOCUMENTS

| JP | 03-148636 | 6/1991 |
| JP | 2001215532 | 8/2001 |
| KR | 100213191 B1 | 5/1999 |
| KR | 1020000065304 A | 11/2000 |
| KR | 1020010073773 | 8/2001 |
| KR | 1020020007037 A | 1/2002 |
| KR | 1020020072882 | 9/2002 |

* cited by examiner

*Primary Examiner*—Charles D. Garber
*Assistant Examiner*—Ron E Pompey
(74) *Attorney, Agent, or Firm*—Cantor Colburn LLP

(57) ABSTRACT

A gate wire including a gate line and a gate electrode is formed on a substrate and a gate insulating layer is formed on the substrate. A semiconductor pattern and an etching assistant pattern are formed on the gate insulating layer and a source/drain conductor pattern and an etching assistant layer are formed on the semiconductor pattern and the etching assistant pattern. A data wire including a data line and source and drain electrodes separated from each other is formed by removing the etching assistant layer and partly removing the source/drain conductor pattern. A pixel electrode connected to the drain electrodes is formed.

7 Claims, 31 Drawing Sheets

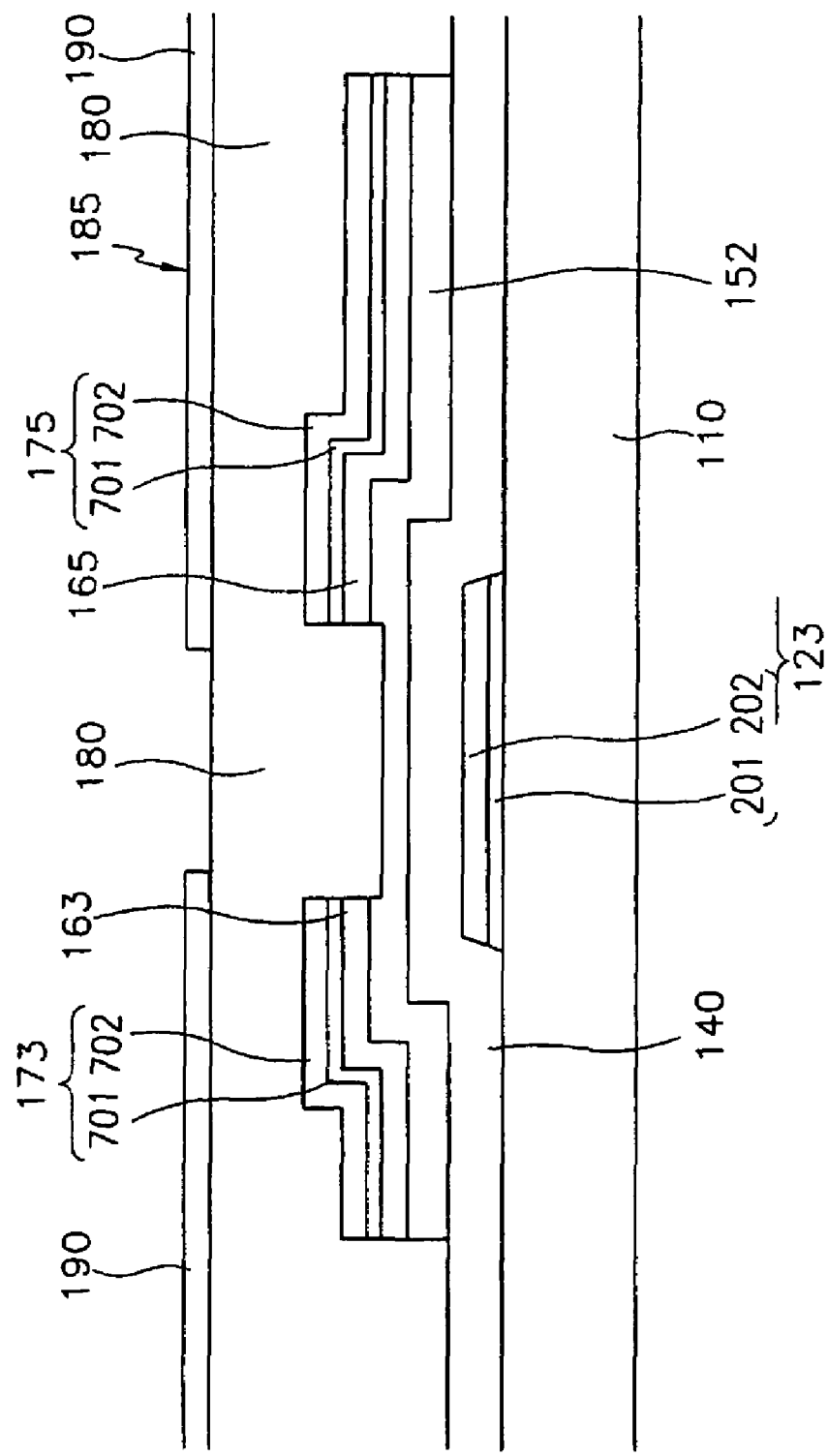

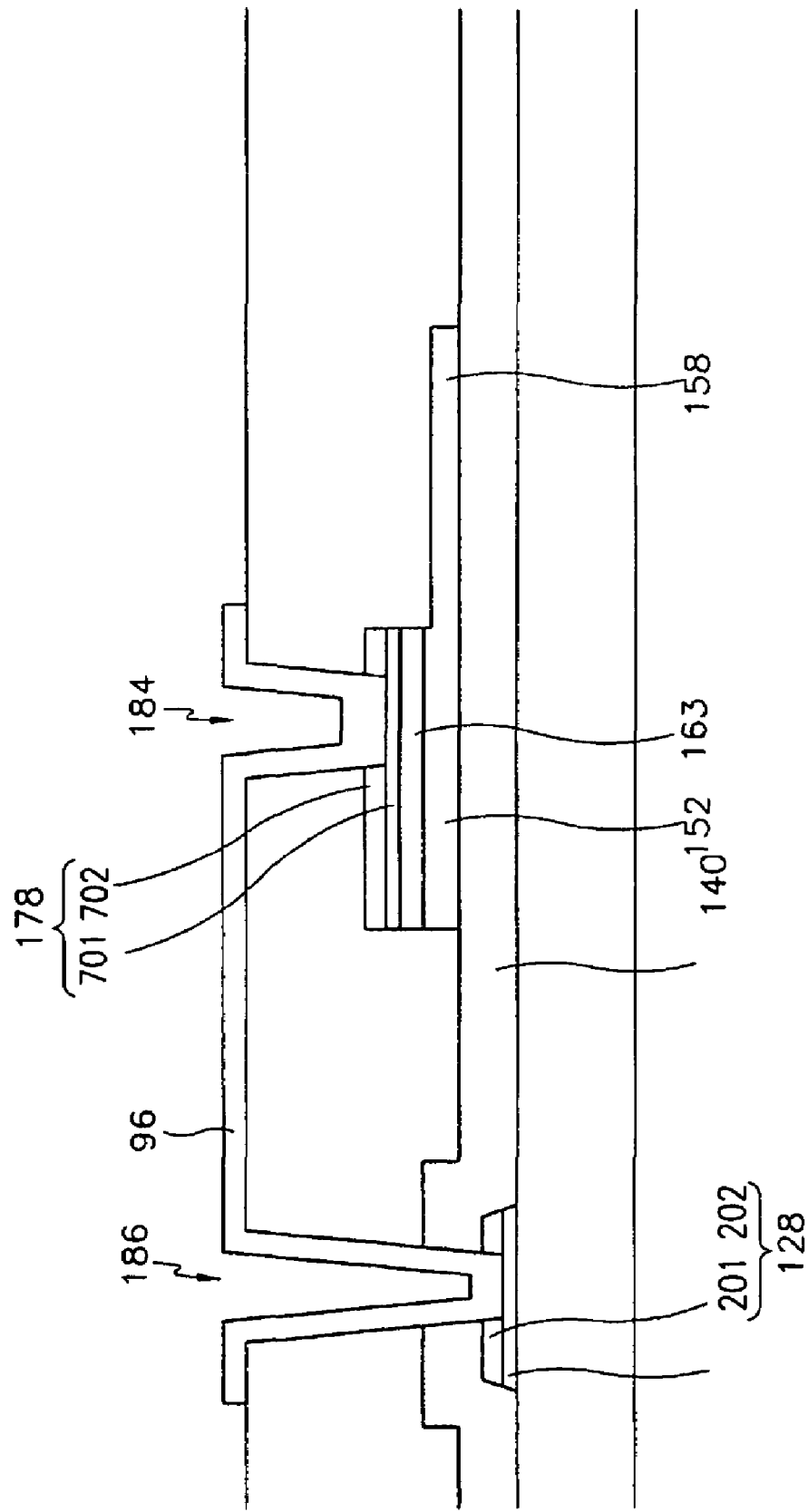

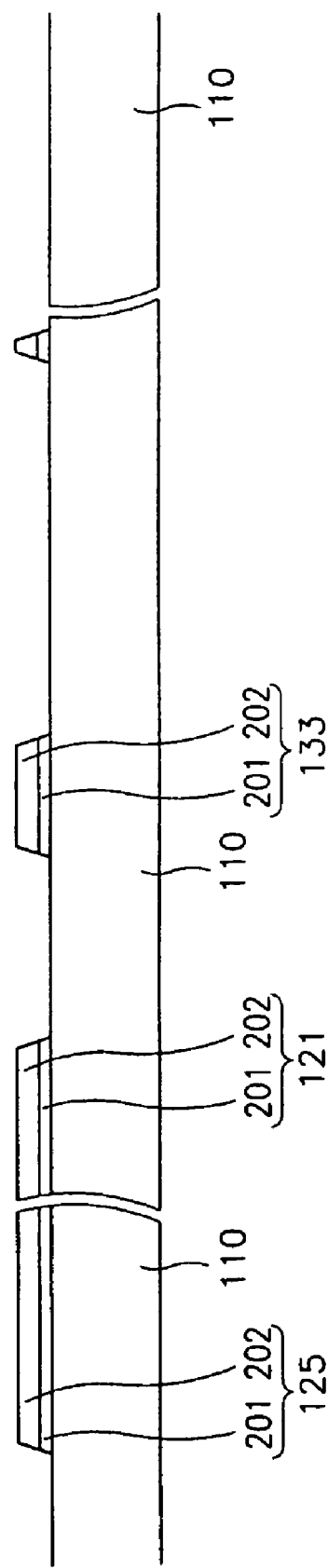

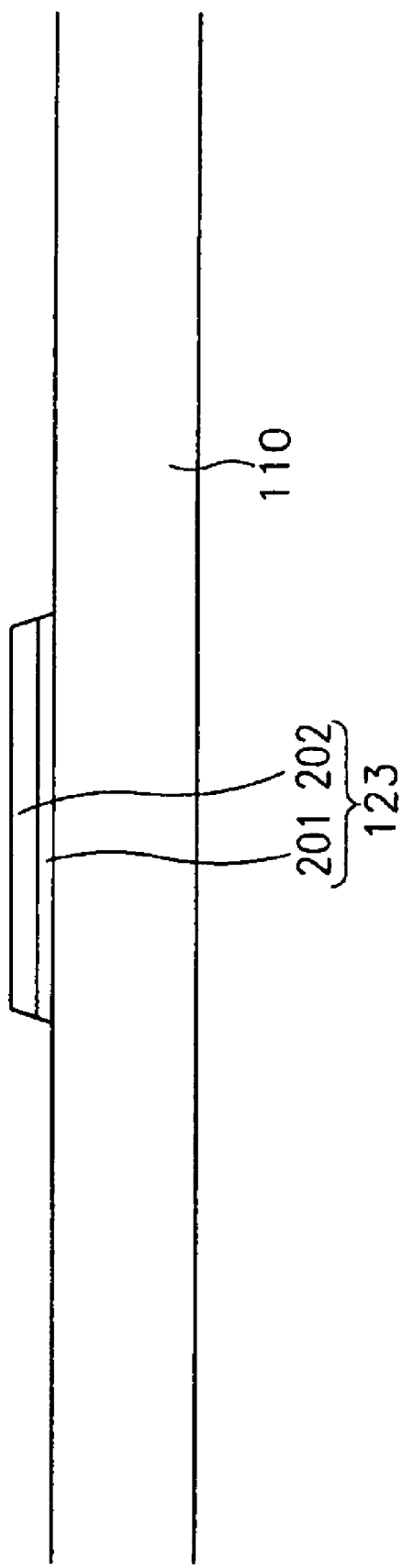

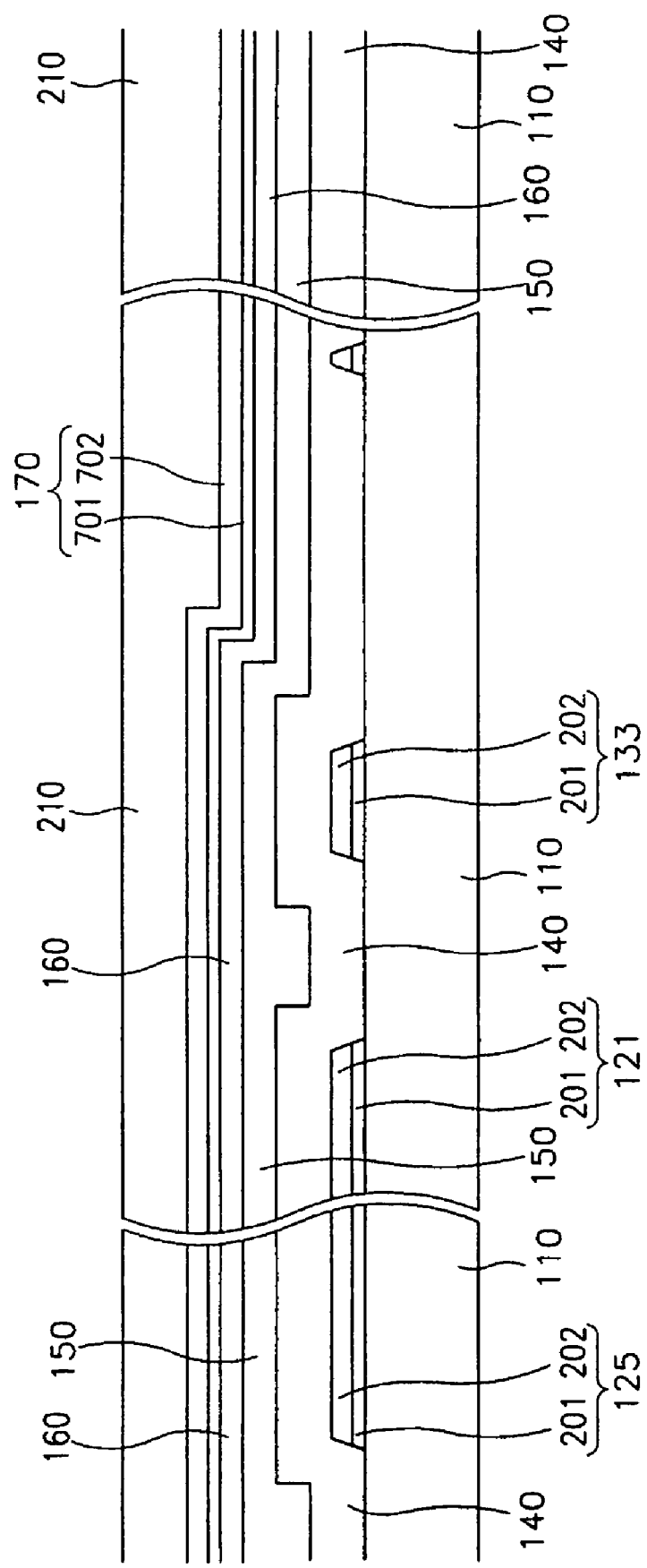

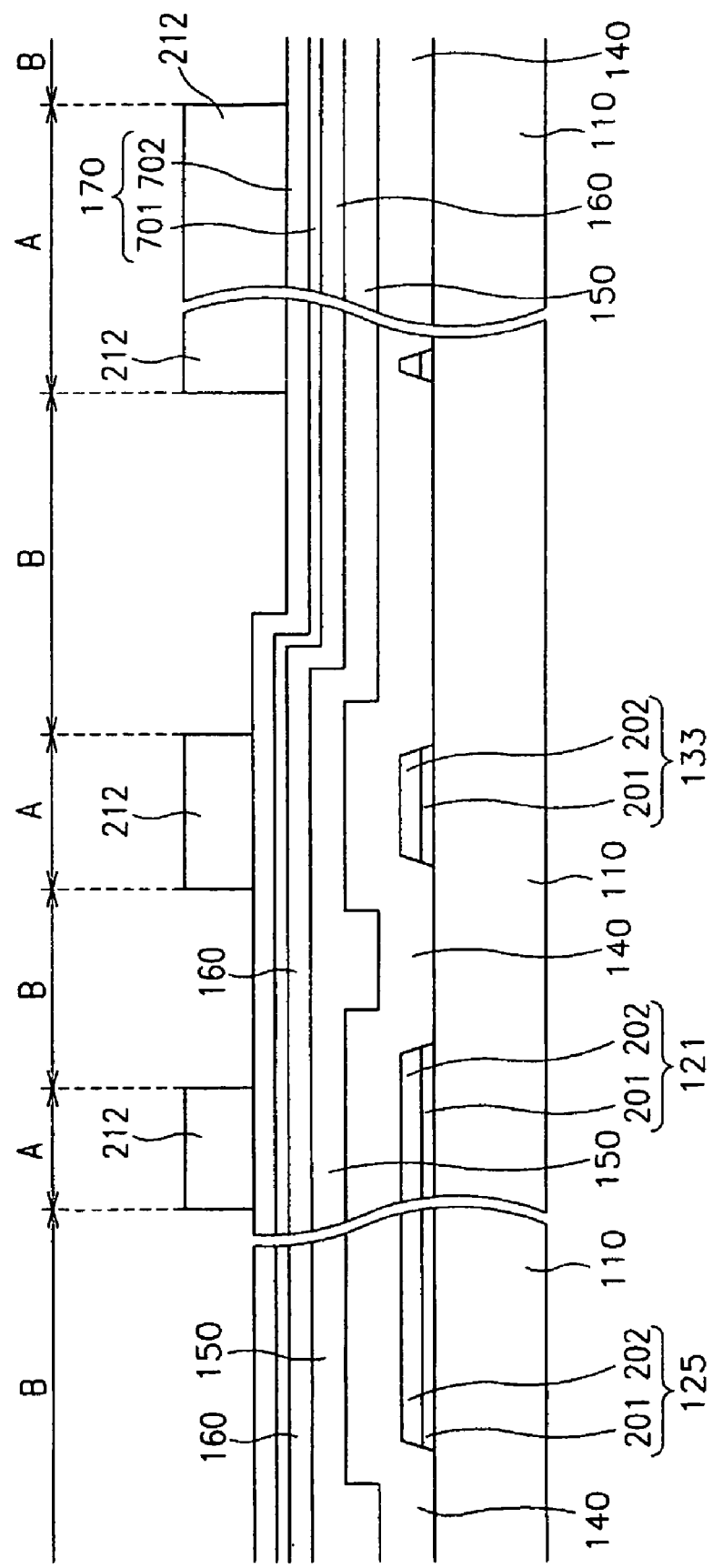

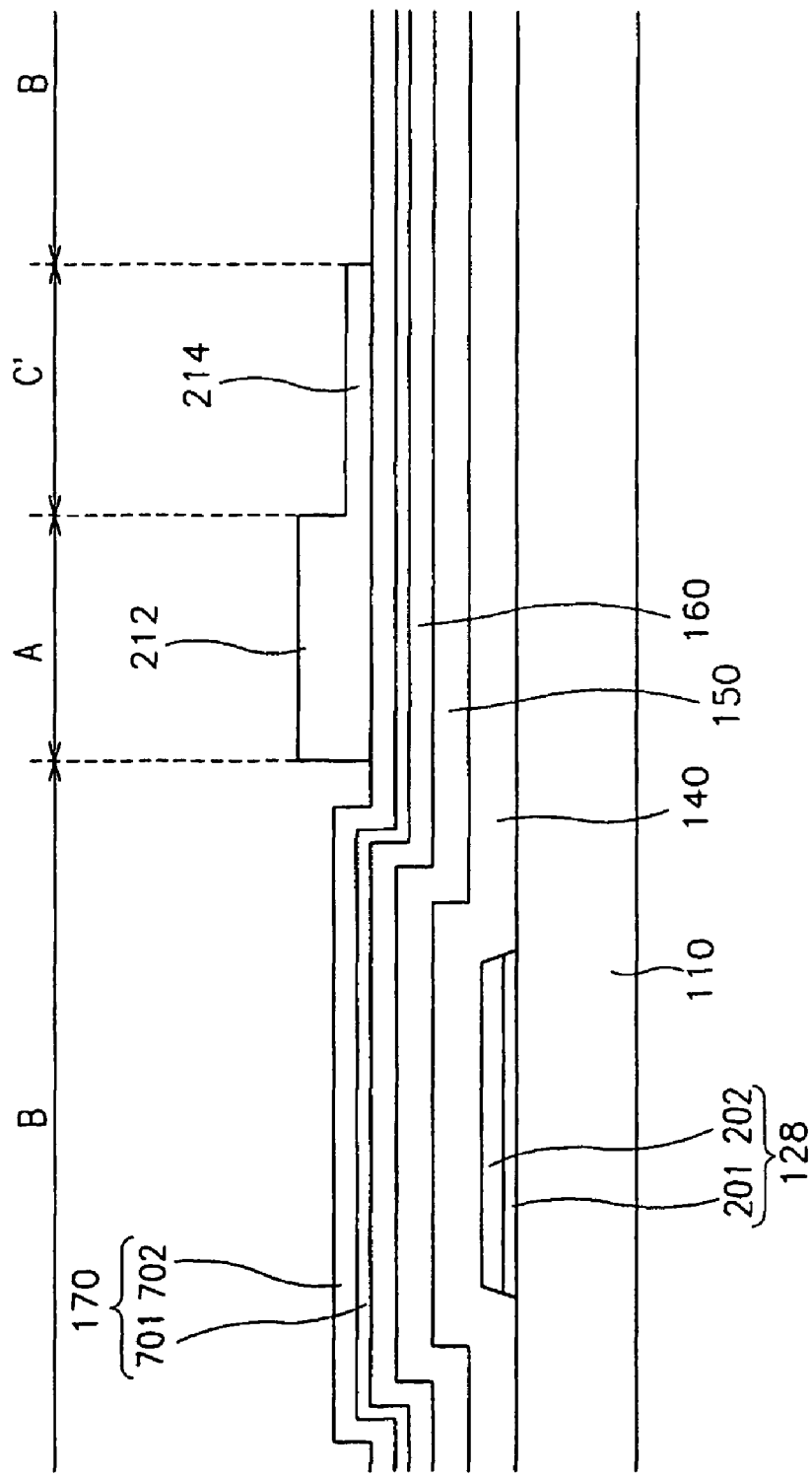

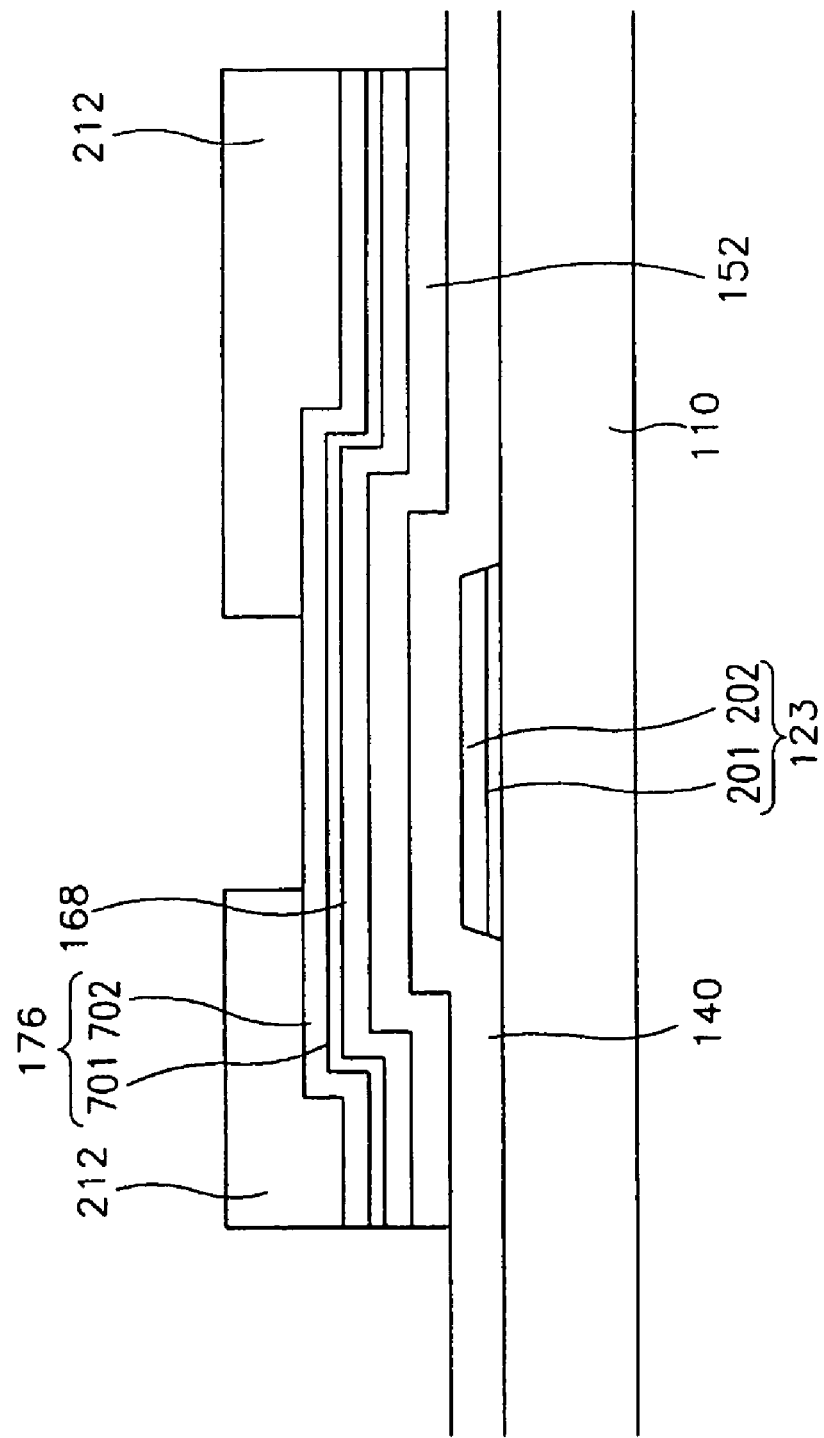

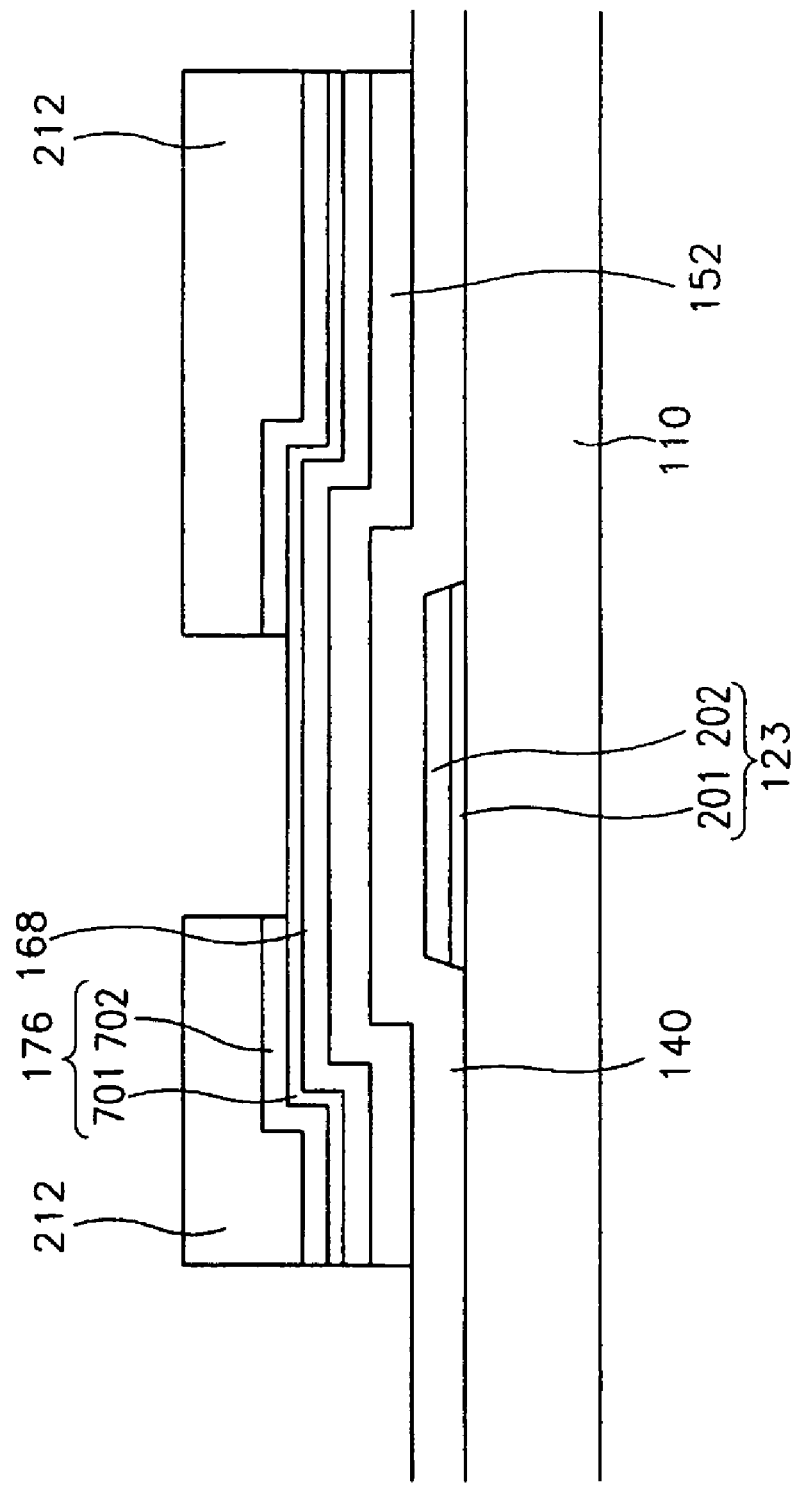

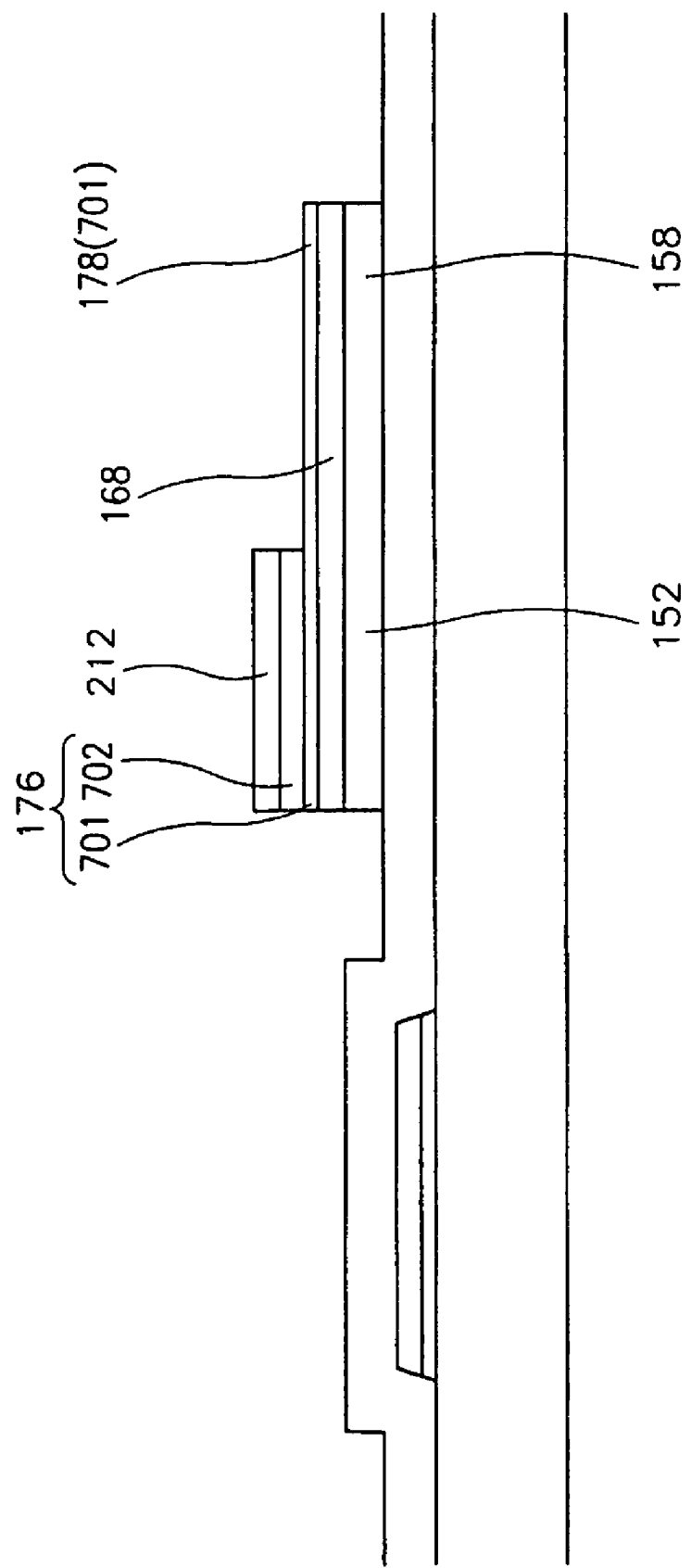

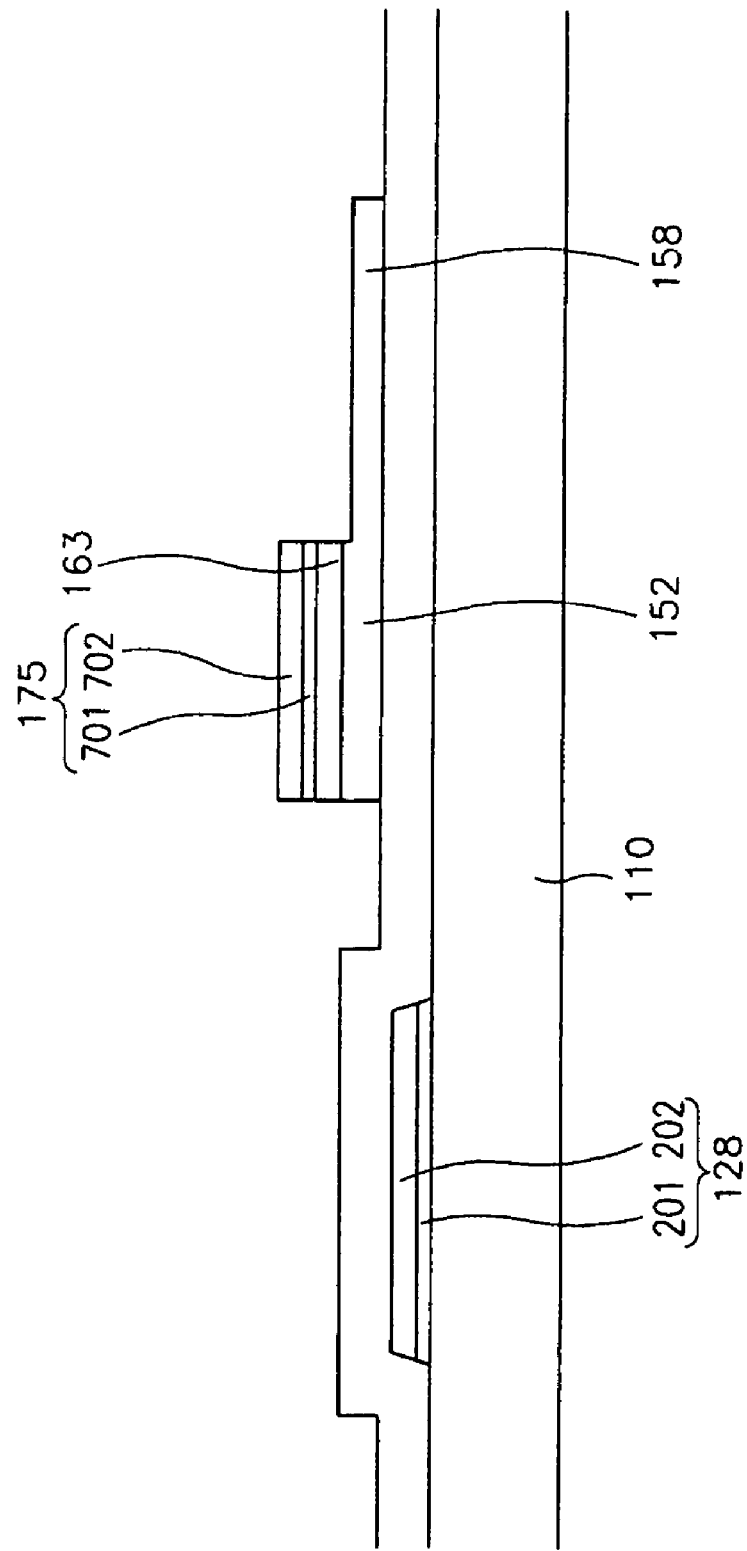

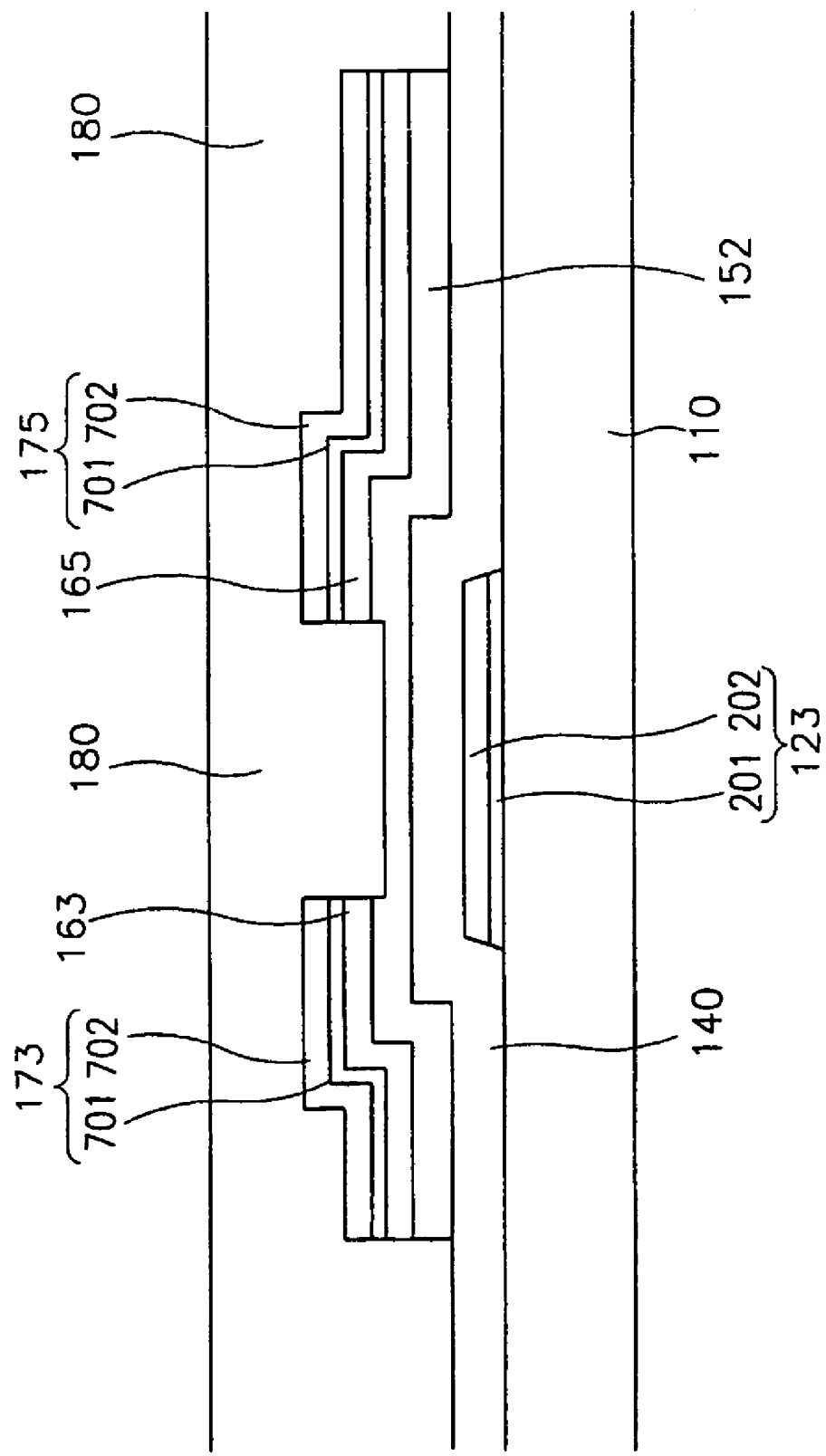

THIN FILM TRANSLATOR ARRAY PANEL AND A METHOD FOR MANUFACTURING THE PANEL

BACKGROUND OF THE INVENTION (a) Field of the Invention

The present invention relates to a thin film transistor array panel and a manufacturing method thereof.

(b) Description of the Related Art

Liquid crystal displays (LCDs) are one of the most widely used flat panel displays. An LCD includes two panels provided with electrodes, a liquid crystal (LC) layer interposed therebetween, and a pair of polarizers attached to outer surfaces of the panels. The LCD displays images by applying voltages to the electrodes to generate an electric field in the LC layer, thereby rearranging LC molecules in the LC layer to adjust transmittance of incident light.

Among LCDs, including field-generating electrodes on respective panels, a kind of LCDs including two panels provided with respective electrodes and thin film transistors (TFTs) for switching the voltages applied to the electrodes are most commonly used. The TFTs are provided one of the two panels.

A gate wire or a data wire transmitting signals are typically made of low resistant material such as Al and Al alloy for preventing signal delay. The data wire has a multi-layered structure including refractory metal such as Cr since it contacts silicon layer.

When manufacturing the LCD, the panel including the TFTs is usually manufactured by photo-etching process with masks and it is desirable to reduce the number of the masks for decreasing product cost. For this purpose, it is suggested a technique of patterning two layers by photo-etching with a single mask to have different patterns, thereby completing the TFT array panels.

However, when patterning conductive multi-layers for forming signal wires in the above-described manufacturing method of the TFT array panel, there is a problem that it is difficult to etch one of the conductive multi-layers and thus to patterning a signal wire.

SUMMARY OF THE INVENTION

A motivation of the present invention is to provide a TFT array panel and a manufacturing method thereof capable of facilitating patterning of multi-layers.

A TFT array panel and a manufacturing method thereof according to an embodiment of the present invention forms an etching assistant layer connected to a data wire such that a lower film has larger areas exposed to an etchant for wet etching.

A method of manufacturing a thin film transistor array panel is provided, which includes: forming a gate wire including a gate line and a gate electrode on a substrate; forming a gate insulating layer on the substrate; forming a semiconductor pattern and an etching assistant pattern on the gate insulating layer; forming a source/drain conductor pattern and an etching assistant layer on the semiconductor pattern and the etching assistant pattern; forming a data wire including a data line and source and drain electrodes separated from each other by removing the etching assistant layer and partly removing the source/drain conductor pattern; and forming a pixel electrode connected to the drain electrodes.

The separation of the source and the drain electrodes are performed by using a photo-etching process using a photoresist pattern, and the photoresist pattern comprises a first portion disposed on an etching assistant portion and having a first thickness, a second portion having a second thickness larger than the first thickness, and a third portion disposed at positions except for the first and the second portions and having a thickness smaller than the first thickness.

A mask used for the photo-etching process comprises a first portion partly transmitting light, a second portion fully transmitting light, and a third portion fully blocking light, and the first, the second and the third portions of the mask is aligned to face the first, the second and the third portions of the photoresist pattern, respectively, during light exposure.

The method may further include forming a contact pattern between the data wire and the semiconductor pattern. The data wire, the contact pattern, the semiconductor pattern, and the etching assistant pattern are preferably formed by using a mask.

The formation of the gate insulating layer, the semiconductor pattern, the contact pattern, and the data wire preferably includes: depositing the gate insulating layer, a semiconductor layer, a contact layer, and a conductive layer; coating a photoresist film on the conductive layer; exposing the photoresist film through the mask; developing the photoresist film to form the photoresist pattern such that the second portion of the photoresist pattern is disposed on the data wire; forming the data wire, the contact pattern, and the semiconductor pattern respectively made of the conductive layer, the contact layer and the semiconductor layer by removing a portion of the conductive layer under the third portion, the semiconductor layer and the contact layer thereunder, the first portion, the conductive layer and the ohmic contact layer under the first portion, and a partial thickness of the second portion; and removing the photoresist pattern.

The formation of the data wire, the contact pattern, the semiconductor pattern, and the etching assistant pattern preferably includes: removing the portion of the conductive layer under the third portion by dry etching or wet etching to form the source/drain conductor pattern and the etching assistant layer; etching the contact layer under the third portion, the semiconductor layer thereunder to complete the semiconductor pattern and the etching assistant pattern under the first and the second portions; and removing the source/drain conductor pattern and the etching assistant layer to complete the data wire and the contact pattern.

Preferably, the data wire includes a lower film including Cr, Mo or Mo alloy and an upper film including Al or Al alloy, and the upper film and the lower film are patterned by wet etching.

BRIEF DESCRIPTION OF THE DRAWINGS

FIGS. 2-4 are sectional views of the TFT array panel shown FIG. 1 taken along the lines II-II', III-III' and IV-IV', respectively

FIGS. 5B-5D are sectional views of the TFT array panel shown in FIG. 5A taken along the lines VB-VB', VC-VC' and VD-XVD', respectively;

FIGS. 6A-6C are sectional views of the TFT array panel shown in FIG. 5A taken along the lines VB-VB', VC-VC' and VD-XVD', respectively, and illustrate the step following the step shown in FIGS. 5B-5D;

FIGS. 7B-7D are sectional views of the TFT array panel shown in FIG. 7A taken along the lines VIIB-VIIB', VIIC-VIIC' and VIIC-VIIC', respectively;

FIGS. 8A, 9A, 10A and 11A, FIGS. 8B, 9B, 10B and 11B, and FIGS. 8C, 9c, 10C and 11C are respective sectional views of the TFT array panel shown in FIG. 7A taken along the lines VIIB-VIIB', VIIC-VIIC' and VIID-VIID', respectively, and illustrate the steps following the step shown in FIGS. 7B-7D;

FIGS. 12B-12D are sectional views of the TFT array panel shown in FIG. 12A taken along the lines XIIB-XIIB', XIIC-XIIC' and XIID-XIID', respectively.

DETAILED DESCRIPTION OF PREFERRED EMBODIMENTS

Figure 1:
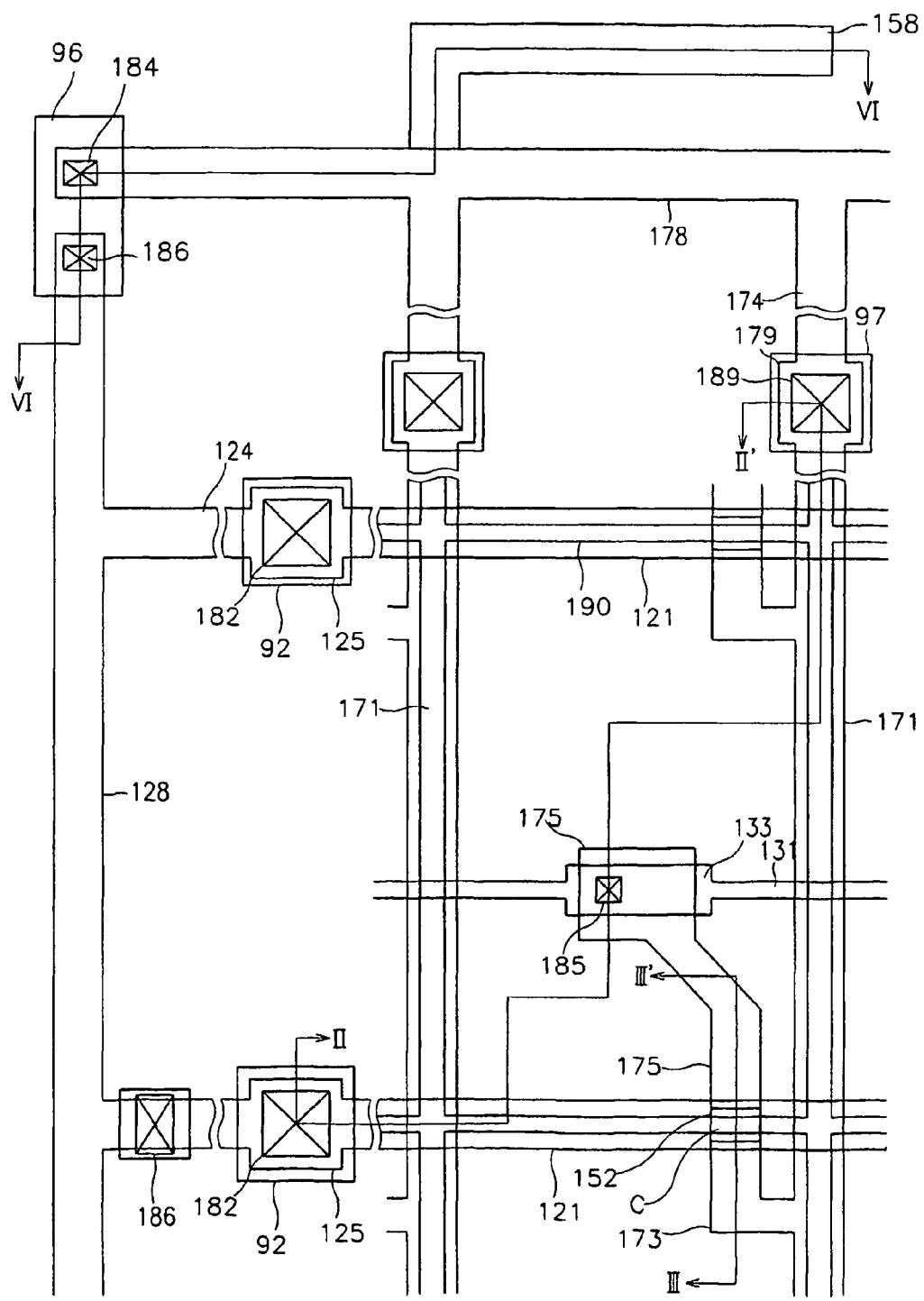
FIG. 1 is a layout view of a TFT array panel for an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Then, signal wires, TFT array panels, and manufacturing methods thereof will be described with reference to accompanying drawings.

A method of manufacturing a wire according to an embodiment of the present invention forms a semiconductor layer and a data wire by photo etching using a single photoresist pattern. It is described in detail with reference to the drawings.

First, a TFT array panel for an LCD according to an embodiment of the present invention is described with reference to FIGS. 1-4.

Figure 2:
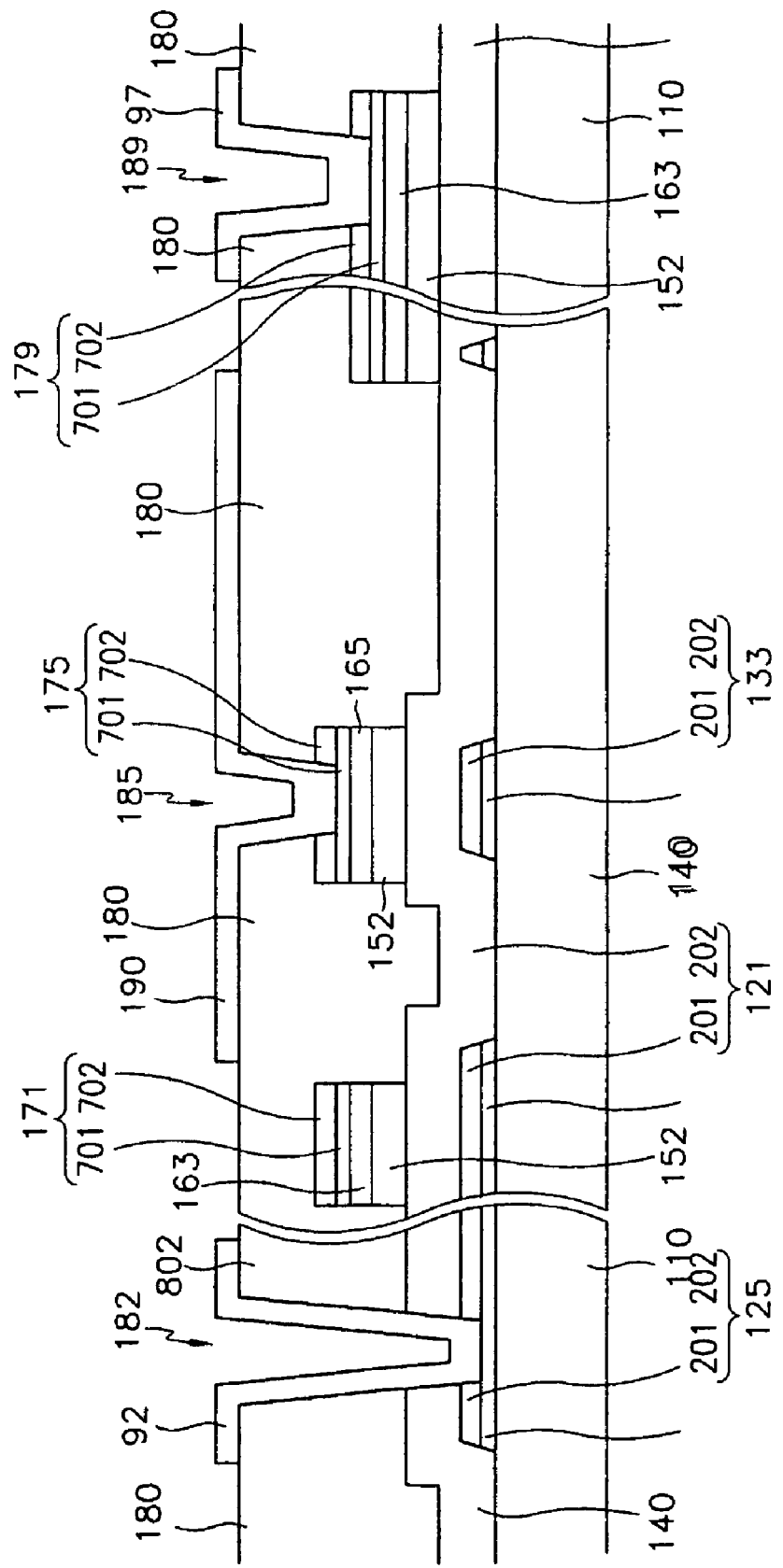
Figure 5A:
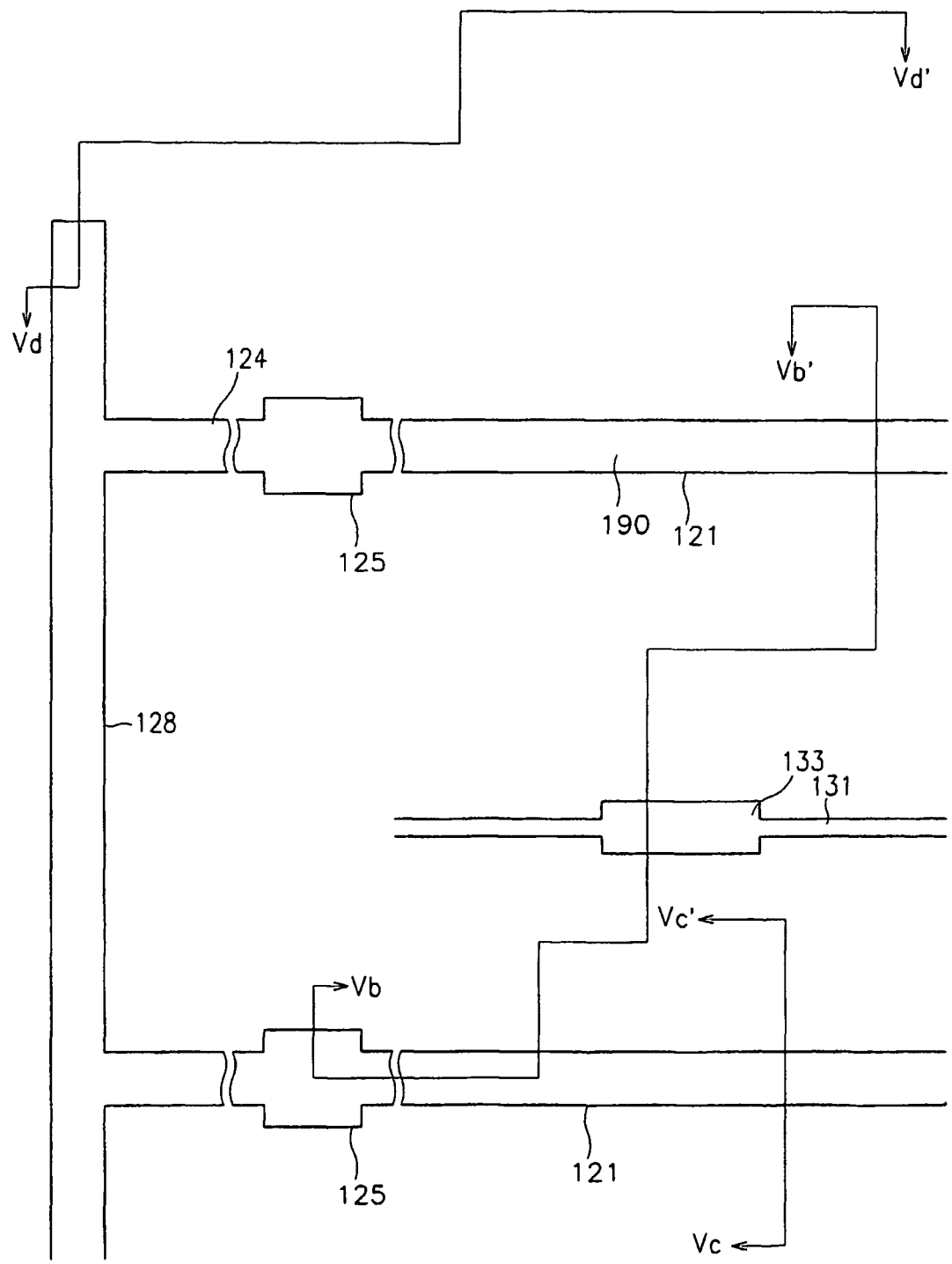
FIG. 5A is a layout view of a TFT array panel in the first step of a manufacturing method thereof according to an embodiment of the present invention.
Figure 5D:
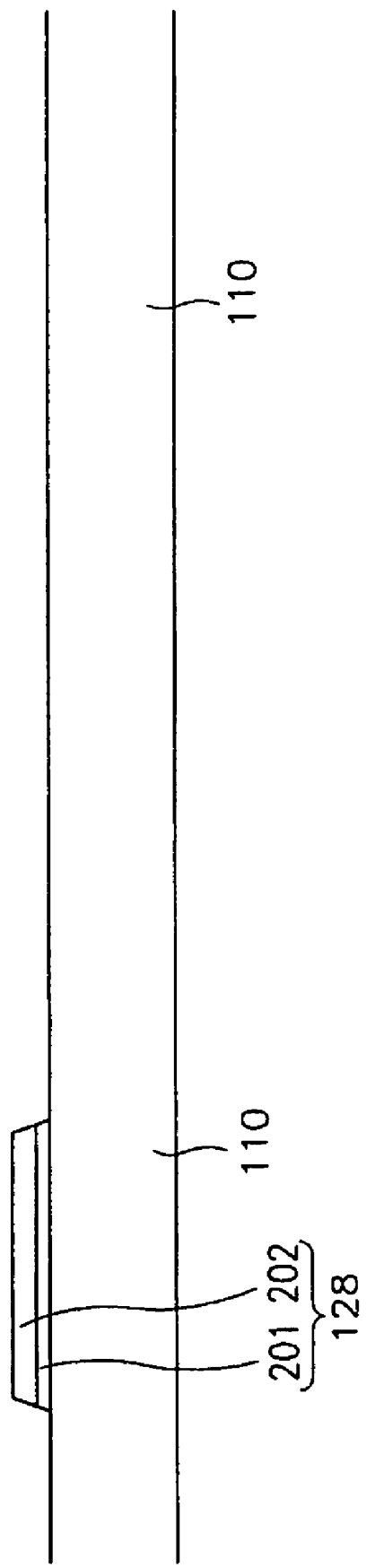

FIG. 1 is a layout view of a TFT array panel for an LCD according to an embodiment of the present invention, and FIGS. 2-4 are sectional views of the TFT array panel shown FIG. 1 taken along the lines II-II', III-III' and IV-IV', respectively.

A gate wire, a storage wire, and a first ESD protection wire are formed on an insulating substrate 110. The gate wire, the storage wire, and the first ESD protection wire include a lower layer preferably made of a material having a good contact characteristic with other materials such as Mo, Mo alloy, and Cr and an upper layer preferably made of conductive material having low resistivity such as Ag, Ag alloy, Al and Al alloy.

The gate wire includes a plurality of gate lines 121 extending in a transverse direction, a plurality of gate pads 125 connected to one ends of the gate lines 121 for receiving gate signals from an external device and transmitting the gate signals to the gate lines, and a plurality of TFT gate electrodes 123 connected to the gate lines 121.

The storage capacitor wire includes a plurality of storage electrode lines 131 parallel to the gate lines 121 and supplied with an external voltage such as a common voltage to be applied to a common electrode of an upper panel and a plurality of storage electrodes 133 connected thereto. The storage electrodes 133 overlap drain electrodes 175 connected to pixel electrodes 190 to form storage capacitors for enhancing the charge storing capacity of pixels, which will be described later. In case the overlapping of the pixel electrodes 190 and the gate lines 121 gives sufficient storage capacitance, the storage capacitor wire may be omitted.

The first ESD protection wire includes a plurality of ESD connection lines 124 connected to the gate pads 125 opposite the gate lines 121 and a gate shorting bar 128 connecting the gate lines 121 in common through the ESD connection lines 124.

The gate wire 121, 123 and 125, the storage wire 131 and 133, and the first ESD protection wire 124 and 128 have tapered lateral sides and the inclination angle thereof ranges from about 30 degrees to 70 degrees.

The gate wire 121, 123 and 125, the storage wire 131 and 133, and the first ESD protection wire 124 and 128 may include a single layer made of low resistivity conductive material.

A gate insulating layer 140 preferably made of SiNx is formed on the gate wire 121, 123 and 125, the first ESD protection wire 124 and 128, and the storage capacitor wire 131 and 133 to cover them.

A semiconductor pattern 152 and an etching assistant pattern 158 preferably made of polysilicon or amorphous silicon are formed on the gate insulating layer 140. An ohmic contact pattern (or an intermediate layer pattern) 163 and 165 preferably made of amorphous silicon heavily doped with n type impurities such as phosphorous P or p type impurities is formed on the semiconductor pattern 152. The etching assistant pattern 158 is made of the same layer as the semiconductor pattern 152 and located out of a pixel area.

A data wire and a second ESD protection wire including a lower layer preferably made of a refractory material having a good contact characteristics with other materials such as Mo, Mo alloy, and Cr and an upper layer preferably made of conductive material having low resistivity such as Ag, Ag alloy, Al and Al alloy are formed on the ohmic contact pattern 163 and 165. The data wire includes a plurality of data line units 171, 173 and 179 and a plurality of drain electrodes 175 of TFTs. Each data line unit includes a data line 171 extending in a longitudinal direction and intersecting the gate lines to define pixel areas, a data pad 179 connected to one end of the data line 171 and receiving image signals from an external device, and a plurality of source electrodes 173 of TFTs branched from the data line 171. Each drain electrode 175 is separated from the data line units 171, 173 and 179 and placed opposite to the corresponding source electrode 173 with respect to the corresponding gate electrode 123 or the channel portion C of the semiconductor pattern 152 of the TFT. In the absence of the storage capacitor wire 131 and 133, the drain electrodes 175 may not extend to the center of the pixel areas. A plurality of storage capacitor conductors 177 overlapping the storage electrodes 133 may be formed separated from the drain electrodes 175.

The second ESD protection wire includes a plurality of ESD connection lines 174 connected to the data pads 179 opposite the data lines 171 and a data shorting bar 178 connecting the data lines 171 in common through the ESD connection lines 174.

The data wire 171, 173, 175 and 179 and the second ESD protection wire 174 and 178 as well as the ohmic contact pattern 163 and 165 and the semiconductor pattern 152 and the etching assistant pattern 158 have tapered lateral sides and the inclination angle thereof ranges from about 30 degrees to 80 degrees.

The ohmic contact pattern 163 and 165 reduces the contact resistance between the underlying semiconductor pattern 152 and the overlying data wire 171, 173, 175 and 179 and has substantially the same shape as the data wire 171, 173, 175 and 179 and the second ESD protection wire 174 and 178. That is, the ohmic contact pattern 163 and 165 includes a plurality of data-line ohmic contacts 163 having substantially the same shapes as the data line units 171, 173 and 179 and a plurality of drain-electrode ohmic contacts 163 having substantially the same shapes as the drain electrodes 173.

Meanwhile, the semiconductor pattern 152 has substantially the same shape as the data wire 171, 173, 175 and 179, the second ESD protection wire 174 and 178, and the ohmic contact pattern 163 and 165 except for the TFT channel areas C. Specifically, the data line units 171, 173 and 175, in particular the source electrode 173 and the drain electrode 175 are separated from each other at the TFT channel areas C, where the data-line ohmic contacts 163 and the drain-electrode ohmic contacts 165 are also separated from each other. However, the TFT semiconductors 152 continue to proceed there without disconnection to form TFT channels.

A passivation layer 180 is formed on the data wire 171, 173, 175 and 179 and the second ESD protection wire 174 and 178, and the semiconductors 152 and the etching assistant pattern 158, which are not covered with the data wire 171, 173, 175 and 179 and the second ESD protection wire 174 and 178. The passivation layer 180 preferably includes an insulating film preferably made of such as an organic photosensitive material having good planarization property or a low dielectric material including a-Si:C:O:H. The passivation layer 180 may further include an insulating film preferably made of silicon nitride, which is preferably disposed under an organic insulating film to directly cover the semiconductor pattern 152. The organic insulating film is preferably completely removed from pad areas P where the gate pads 125 and the data pads 179 are provided, which is particularly advantageous for a COG (chip on glass) type mounting gate driving integrated circuits and data driving integrated circuits directly on the TFT panel for transmitting scanning signals and data signals to the gate pads 125 and the data pads 179, respectively.

The passivation layer 180 has a plurality of contact holes 185 and 189 exposing the drain electrodes 175 and the data pads 179. The passivation layer 180 together with the gate insulating layer 140 is further provided with a plurality of contact holes 182 exposing the gate pads 125. In addition, the passivation layer 180 further has a plurality of contact holes 184 and 186 exposing the first and the second ESD protection wires 124, 128, 174 and 178. The upper films 202 and 702 are removed at the contact holes 182, 184, 185, 186 and 189 to expose the lower films 201 and 701 having good contact characteristics with other materials.

A plurality of pixel electrodes 190 receiving image signals from the TFTs and generating electric fields in cooperation with an electrode of an upper panel are formed on the passivation layer 180. The pixel electrodes 190 are made of a transparent conductive material such as ITO and IZO. The pixel electrodes 190 are physically and electrically connected to the drain electrodes 175 through the contact holes 185 to receive the image signals. The pixel electrodes 190 overlap the neighboring gate lines 121 and the adjacent data lines 171 to enlarge the aperture ratio, but the overlapping may be omitted.

Meanwhile, a plurality of subsidiary gate pads 92 and a plurality of subsidiary data pads 97 are formed on the gate pads 125 and the data pads 179 to be connected thereto through the contact holes 182 and 189, respectively. The subsidiary gate pads 92 and the subsidiary data pads 97 compensate the adhesiveness of the pads 125 and 179 to external circuit devices and protect the pads 125 and 179. The subsidiary gate pads 92 and the subsidiary data pads 97 are not requisites but may be introduced in a selective manner.

An ESD connection pattern 96 connected to the first and the second ESD protection wires 124, 128, 174 and 178 through the contact holes 184 and 186 is also formed on the passivation layer 180.

A method of manufacturing the TFT array panel for an LCD shown in FIGS. 1-4 will be now described in detail with reference to FIGS. 5A to 12D as well as FIGS. 1-4.

First, as shown in FIGS. 5A-5D, a lower film 201 preferably made of Mo, Mo alloy or Cr and an upper film 202 preferably made of Al or Al alloy are deposited in sequence and both films 201 and 202 are deposited on a substrate 110 and the upper film 202 and the lower film 201 are patterned by photo-etching using a mask to form a gate wire including a plurality of gate lines 121, a plurality of gate electrodes 123, and a plurality of gate pads 125, a first ESD protection wire including a gate shorting bar 128 and a plurality of ESD connection lines 124, and a storage wire including a plurality of storage electrode lines 131 and a plurality of storage electrodes 133.

Figure 6B:
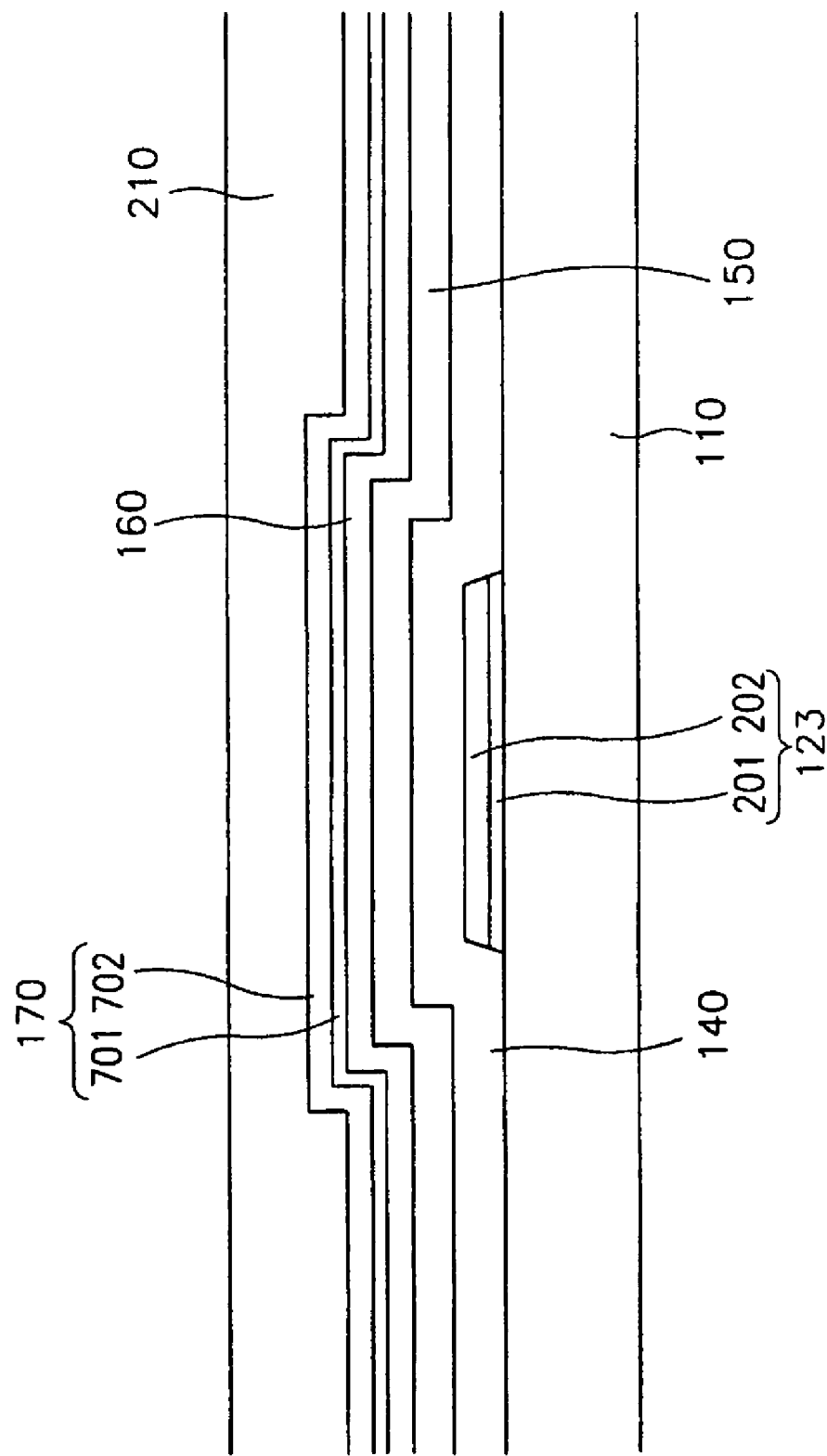
Figure 6C:
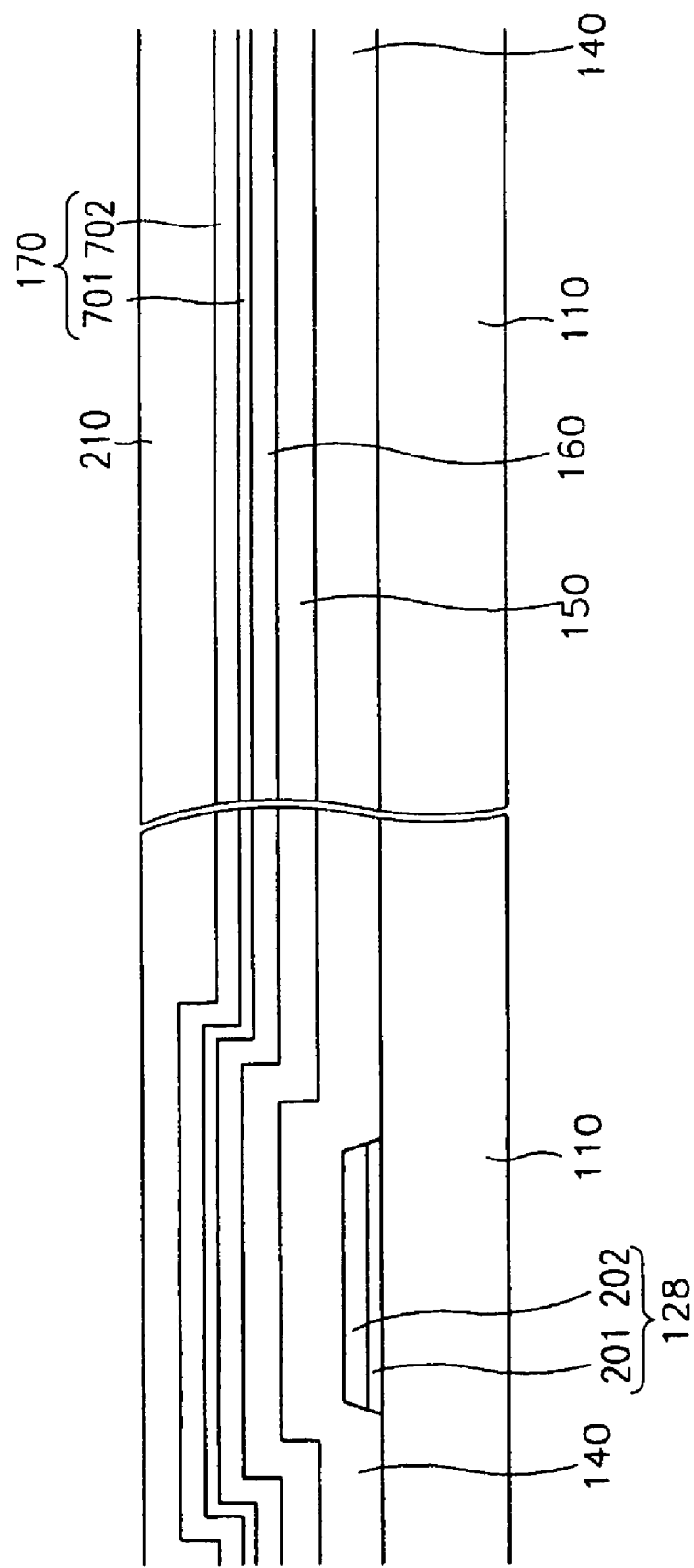

As shown in FIGS. 6A-6C, a silicon nitride gate insulating layer 140 with 1,500-5,000 Å thickness, a semiconductor layer 150 of undoped amorphous silicon with 500-2,000 Å thickness, and an intermediate layer 160 with 300-600 Å thickness are sequentially deposited on the substrate 110 by CVD. A lower film 701 preferably made of Mo, Mo alloy or Cr and an upper film 702 are deposited in sequence, conductive layer 170 and a photoresist film 210 with thickness of 1-2 microns is coated thereon.

Figure 7A:
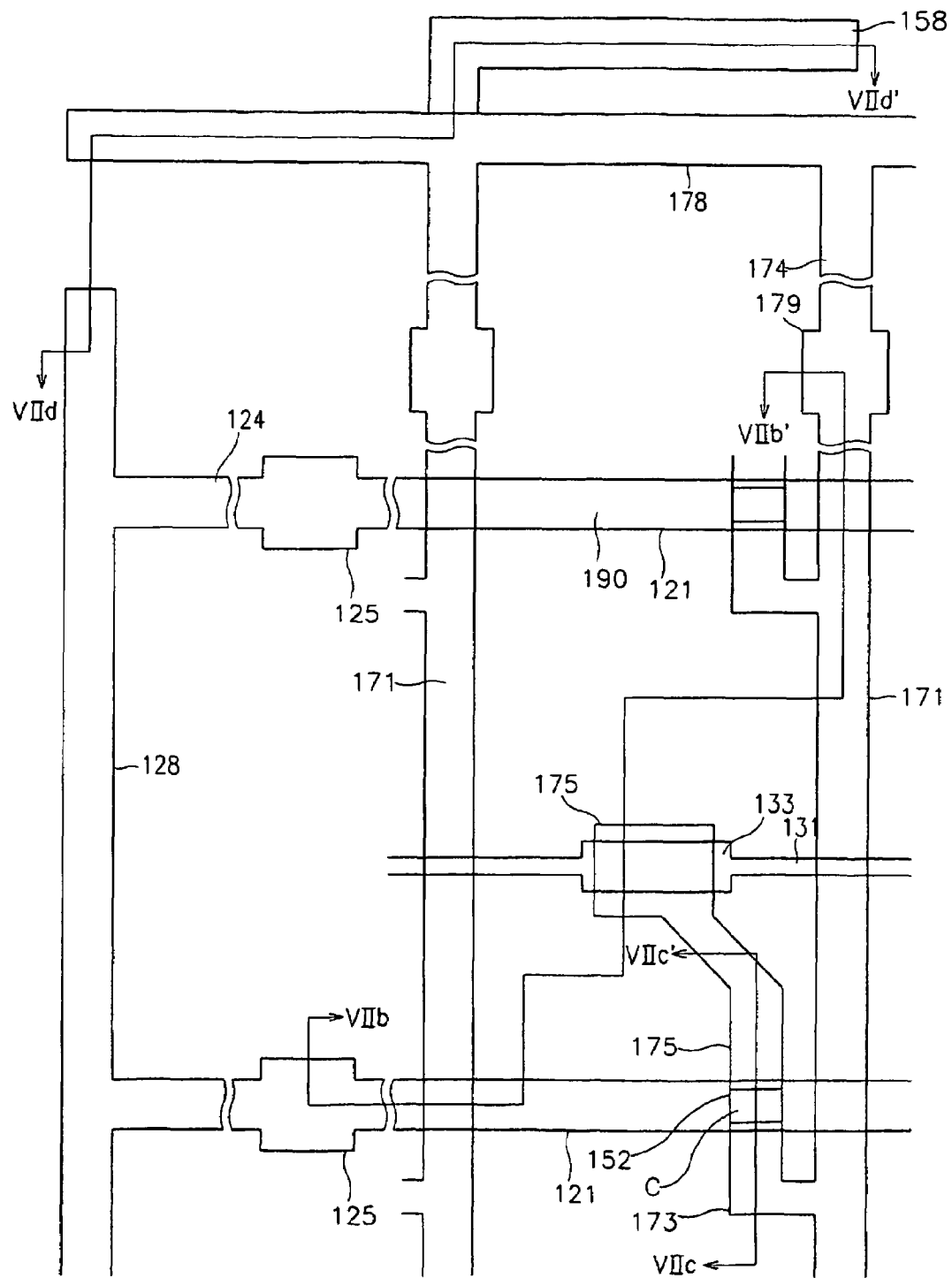
FIG. 7A is a layout view of the TFT array panel in the step following the step shown in FIGS. 6A-6C.
Figure 7C:
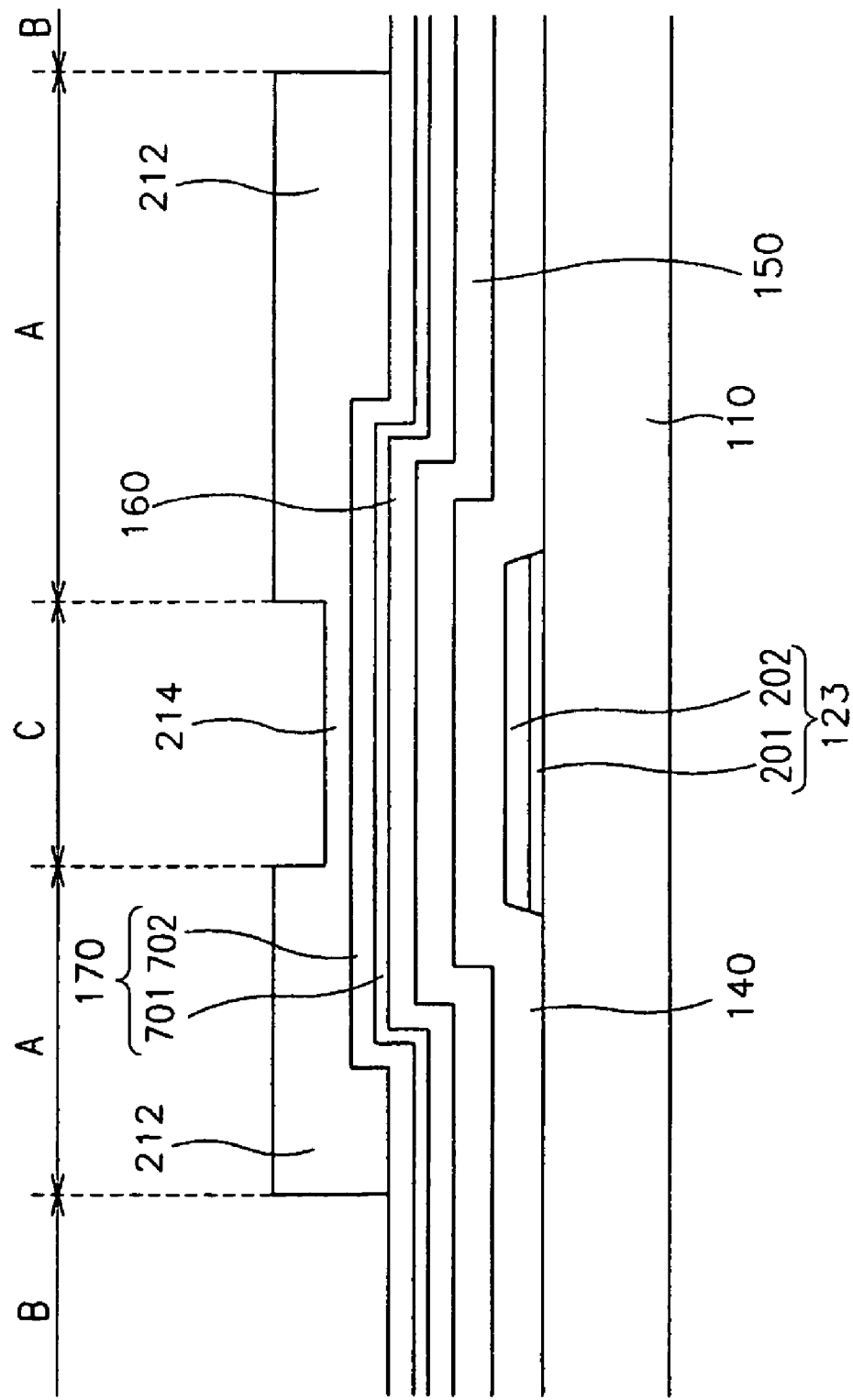

Thereafter, the photoresist film 210 is exposed to light through a mask and is developed to form a photoresist pattern 212 and 214 having a plurality of first portions 212 and a plurality of second portions 214 as shown in FIGS. 7B-7D. Each of the first portions 214 of the photoresist pattern 212 and 214 is located on the channel area C of a TFT or an etching assistant area C', which is placed between a source electrode 173 and a drain electrode 175 or near a data shorting bar 178. Each of the second portions 212 is located on a wire area A located at a place where a data wire 171, 173, 175, 177 and 179 or a second ESD protection wire 174 and 178 will be formed. All portions of the photoresist film 210 on the remaining areas B are removed, and the first portions 214 are made to be thinner than the second portions 212. Here, the ratio of the thickness of the first portion 214 on the channel area C and the etching assistant area C' and the second portion 212 on the wire area A is adjusted depending on process conditions of subsequent etching steps described later, and it is preferable that the thickness of the first portion 214 is equal to or less than a half of that of the second portion 212, for example, equal to or less than 4,000 Å. The reason why the thickness of the portion on the etching assistant area C' is equal to that on the channel area C is to easily etching the lower film 701 when removing the conductive layer 170 to expose the semiconductor layer 150 at the channel area C, which will be described later in detail.

The position-dependent thickness of the photoresist pattern 212 and 214 are obtained by several techniques. A slit pattern, a lattice pattern or a translucent film is provided on the mask in order to adjust the light transmittance in the channel area C and the etching assistant area C'.

When using a slit pattern, it is preferable that width of the slits and a gap between the slits is smaller than the resolution of an exposer used for the photolithography. In case of using a translucent film, thin films with different transmittances or different thickness may be used to adjust the transmittance on the masks.

When a photoresist film 210 is exposed to light through such a mask, polymers of a portion directly exposed to the light are almost completely decomposed, and those of a portion exposed to the light through a slit pattern or a translucent film are not completely decomposed because the amount of a light irradiation is small. The polymers of a portion of the photoresist film 210 blocked by a light-blocking film provided on the mask is hardly decomposed. After the photoresist film 210 is developed, the portions containing the polymers, which are not decomposed, is left. At this time, the thickness of the portion with less light exposure is thinner than that of the portion without light exposure. Since too long exposure time decomposes all the molecules, it is necessary to adjust the exposure time.

The first portion 214 of the photoresist pattern 212 and 214 may be obtained using reflow. That is, the photoresist film 100 is made of a reflowable material and exposed to light through a normal mask having opaque and transparent portions. The photoresist film 210 is then developed and subject to reflow such that portions of the photoresist film 210 flows down onto areas without photoresist, thereby forming the thin portion 214.

Next, the photoresist film 214 and the underlying layers including the conductive layer 170, the intermediate layer 160 and the semiconductor layer 150 are etched such that the data wire, the second ESD protection wire and the underlying layers are left on the wire areas A, only the semiconductor layer is left on the channel areas C, and all the three layers 170, 160 and 150 are removed to expose the gate insulating layer 140 on the remaining areas B.

Figure 8A:
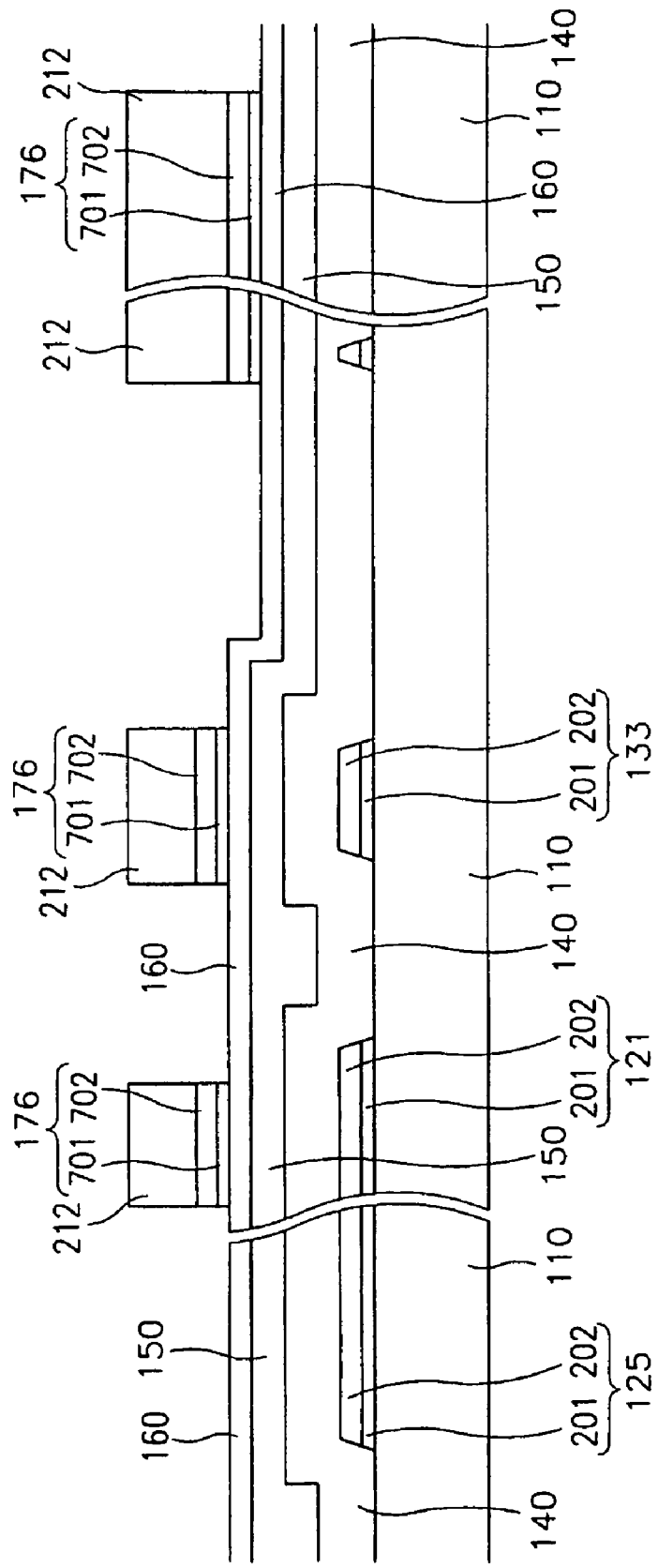
Figure 8B:
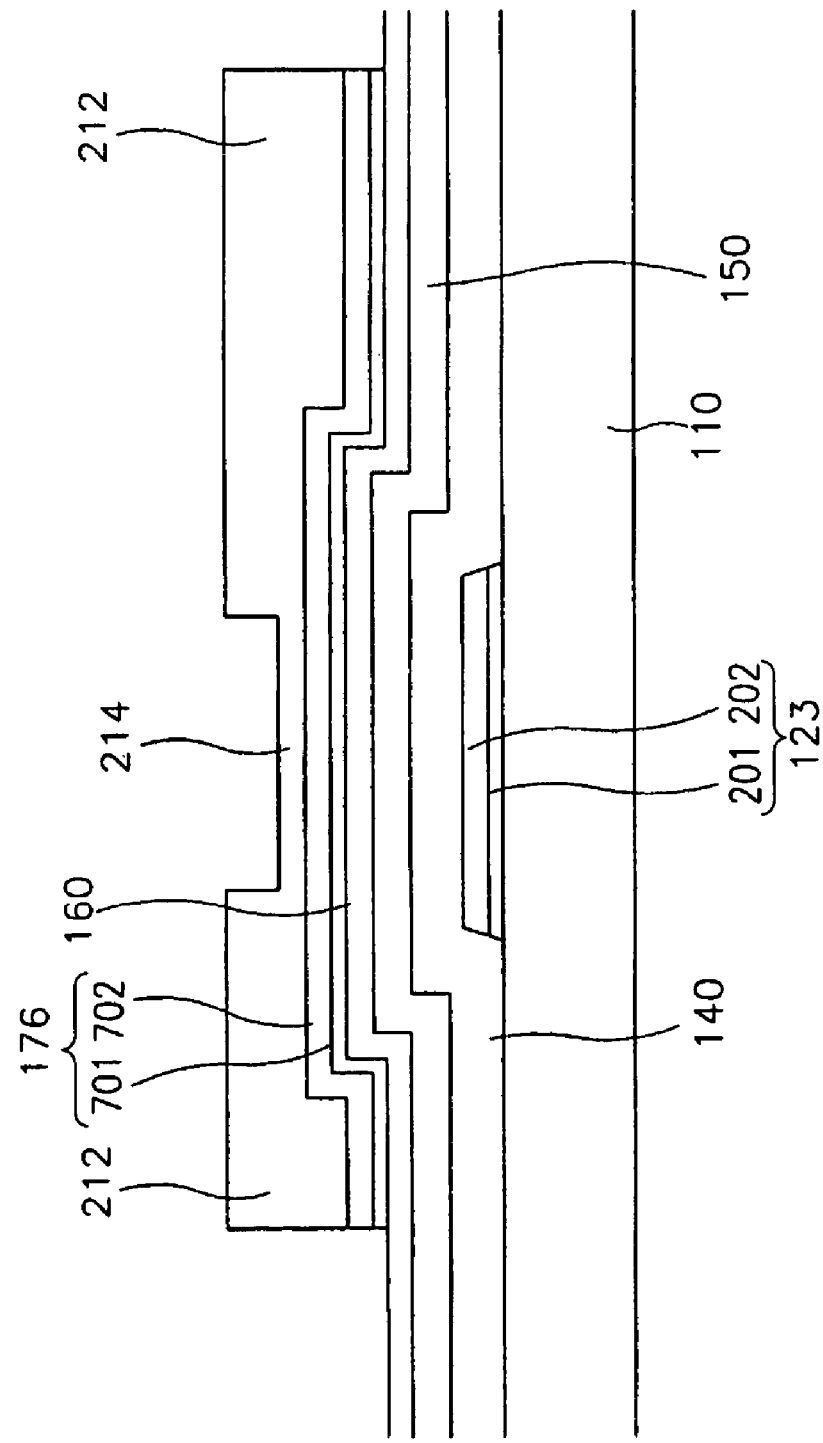
Figure 8C:
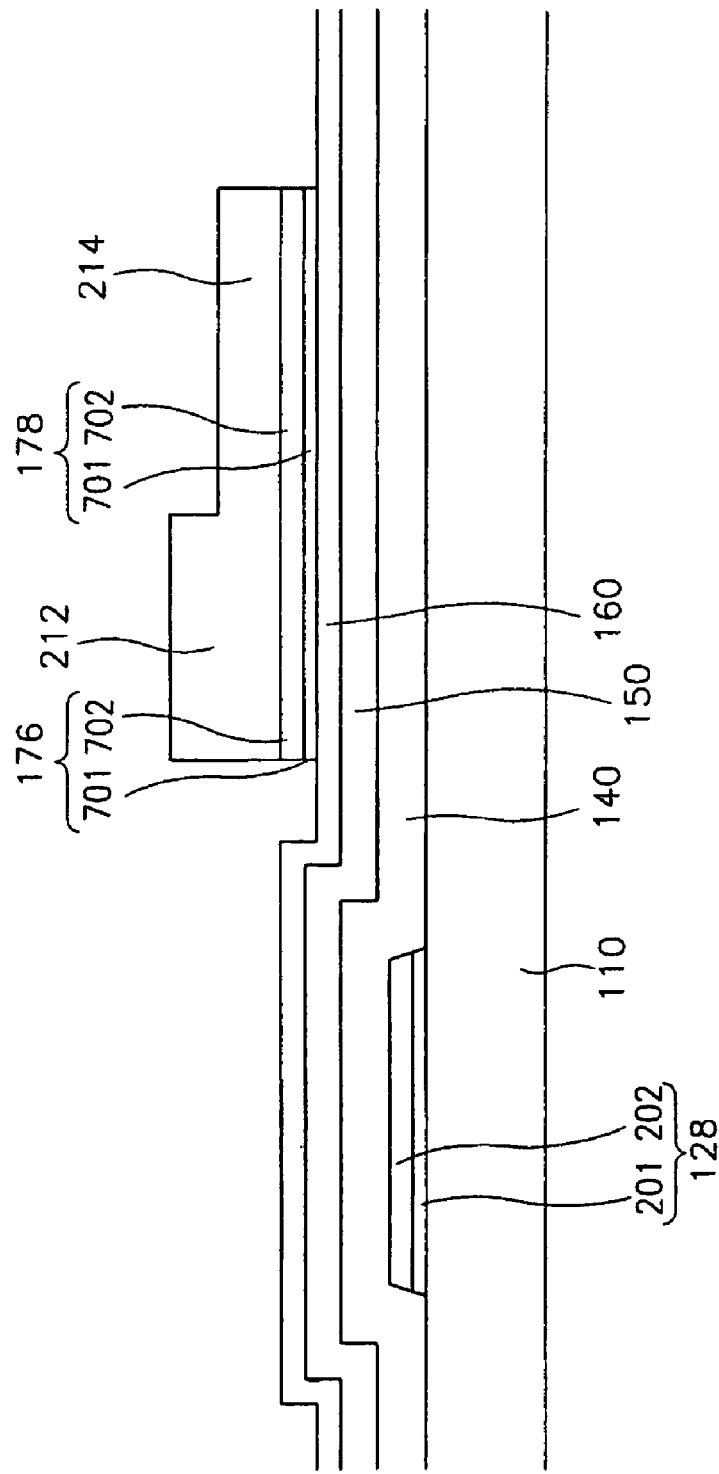

First, as shown in FIGS. 8A-8C, the exposed portions of the conductive layer 170 on the other areas B are removed to expose the underlying portions of the intermediate layer 160. Both dry etch and wet etch are selectively used in this step and preferably performed under the condition that the conductive layer 170 is easily etched and the photoresist pattern 212 and 214 are hardly etched. However, since it is hard to identify the above-described condition for dry etch, and the dry etch may be performed under the condition that the photoresist pattern 212 and 214 and the conductive layer 170 are etched simultaneously. In this case, the first portion 214 for dry etch is preferably made to be thicker than that for the wet etch to prevent the removal of the first portion 214 and thus the exposure of the underlying portions of the conductive layer 170.

As a result, as shown in FIGS. 8A-8C, only the portions of the conductive layer 170 on the channel areas C, the etching assistant areas C', and the wire areas A, that is, an etching assistant layer 178 and the source/drain ("S/D") conductors 176 are left and the remaining portions of the conductive layer 170 on the remaining areas B are removed to expose the underlying portions of the intermediate layer 160. Here, the S/D conductors 64 have substantially the same planar shapes as the data wire 171, 173, 175 and 179 and the second ESD protection wire 174 and 178 except that the source electrodes 173 and the drain electrodes 175 are not disconnected from but connected to each other. When using dry etch, the thickness of the photoresist pattern 212 and 214 is reduced to an extent.

Figure 9A:
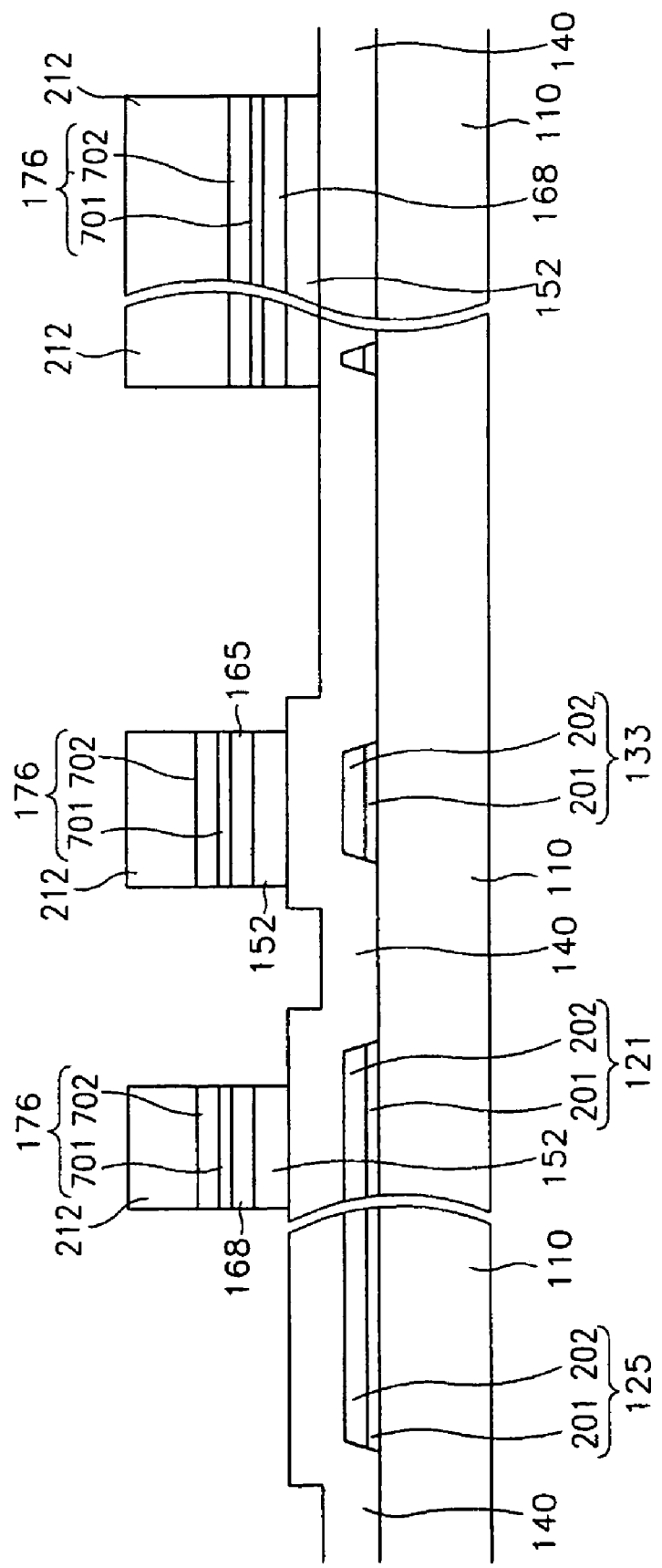
Figure 9C:
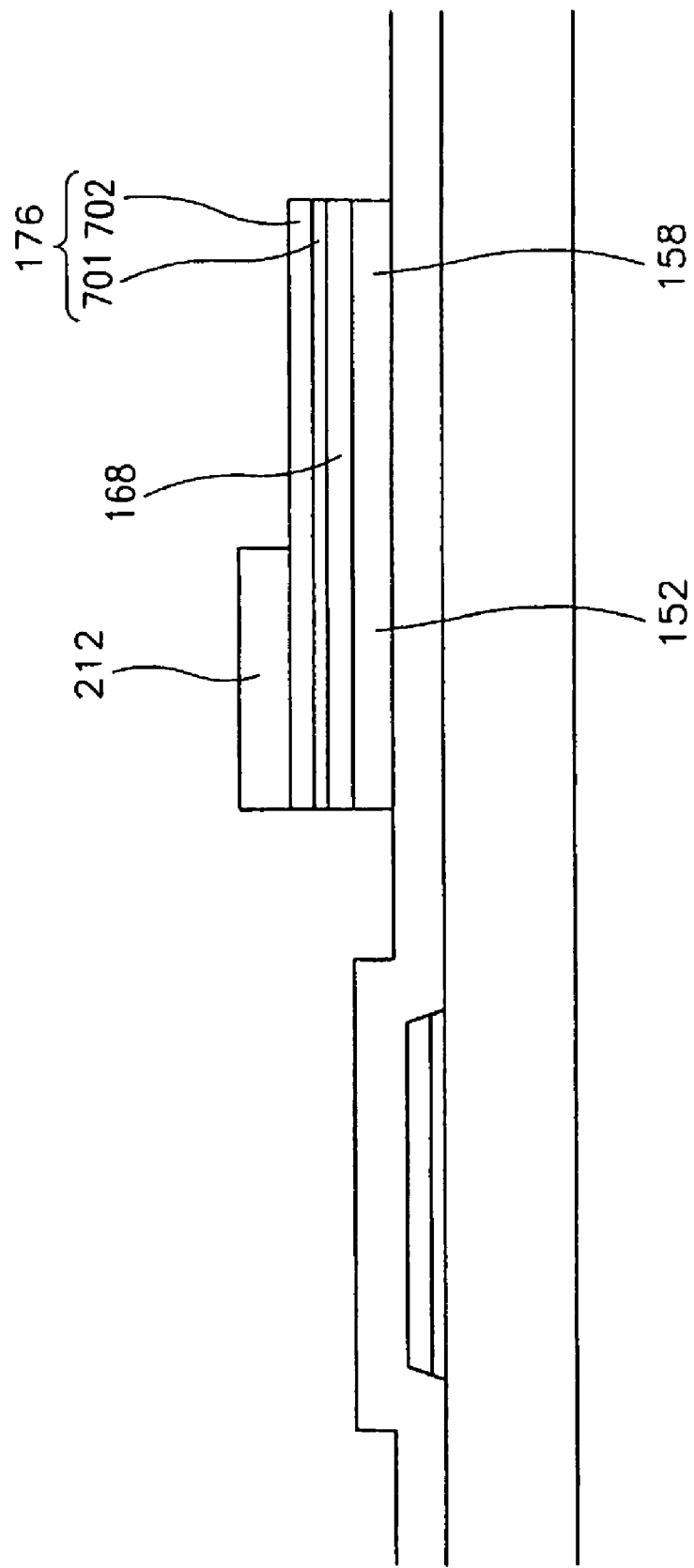

Next, as shown in FIGS. 9A-9C, the exposed portions of the intermediate layer 160 and the underlying portions of the semiconductor layer 150 on the areas B as well as the first portion 214 of the photoresist pattern 212 and 214 are removed by dry etch. The etching is performed under the conduction that the photoresist pattern 212 and 214, the intermediate layer 160 and the semiconductor layer 150 are easily etched and the gate insulating layer 140 is hardly etched. (It is noted that etching selectivity between the intermediate layer and the semiconductor layer is nearly zero.) In particular, it is preferable that the etching ratios for the photoresist pattern 212 and 214 and the semiconductor layer 150 are nearly the same. For instance, the etched thicknesses of the photoresist pattern 212 and 214 and the semiconductor layer 150 can be nearly the same by using a gas mixture of $SF_6$ and HCl, or a gas mixture of $SF_6$ and $O_2$. When the etching ratios for the photoresist pattern 212 and 214 and for the semiconductor pattern 150 are the same, the initial thickness of the first portion 214 is equal to or less than the sum of the thickness of the semiconductor layer 150 and the thickness of the intermediate layer 160.

Consequently, as shown in FIGS. 9A-9C, the first portions 214 on the channel areas C and the etching assistant areas C' are removed to expose the underlying portions of the S/D conductors 176 and the etching assistant layer 178, and the portions of the intermediate layer 160 and the semiconductor layer 150 on the remaining areas B are removed to expose the underlying portions of the gate insulating layer 140. In the meantime, the second portions 212 on the wire areas A are also etched to become thinner. Moreover, the semiconductor pattern 152 and the etching assistant pattern 178 are completed in this step. The reference numerals 168 refer to S/D ohmic contacts under the S/D conductors 176 and the etching assistant layer 178.

Then, photoresist remnants left on the surface of the S/D conductors 176 on the channel areas C and the etching assistant areas C' are removed by ashing or etch back.

Figure 10A:
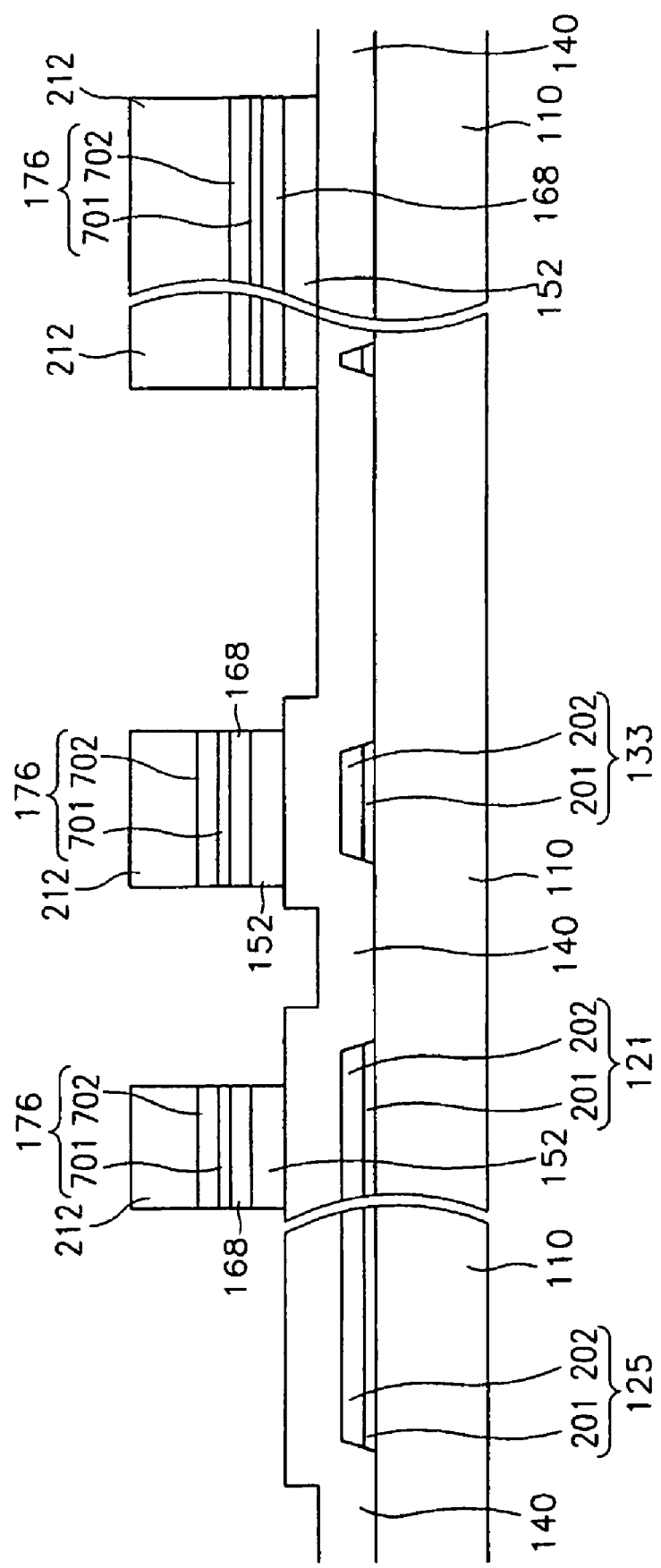

Next, as shown in FIGS. 10A-10C, in order to remove portions of the S/D conductors 176 and the underlying portions of the S/D ohmic contacts 168 on the channel areas C for exposing the semiconductor pattern 152 of the channel areas 168, portions of the upper film 702 of portions of the S/D conductors 176 on the channel areas C and the etching assistant areas C' is first removed using the photoresist as an etch mask.

Successively, exposed portions of the lower film 701 of the conductive layer 176 and 178 are etched. The etching of the lower film 701 made of Cr is performed by wet etching, and the lower film 701 of Cr and the upper film 702 of Al or Al alloy along with an etchant form a galvanic cell. At this time, if the area of the portions of the lower film 701 exposed to the etchant is less than three times the area of the upper film 702, the lower film 701 of Cr may not be completely removed such that remnant of the lower film 701 deteriorates the characteristics of the TFTs. In order to prevent such a problem, the embodiment of the present invention remains the etching assistant layers 178 connected to the S/D conductors 176 for securing the large area of the lower film 701 exposed to the etchant of wet etching. The area of the portions of the lower film 701 exposed to the etchant after etching the upper film 702 is preferably seven times, and more preferably ten times the area of the upper film 701.

In the meantime, when an additional ashing step is performed after the upper film 702 is removed as shown in FIGS. 10A-10C, the lower layer 701 of Cr is well etched even in the case that the area of the portions of the lower film 701 exposed to the etchant is three times. It is because oxide of Al or Al alloy is formed on the upper film 702 after the ashing step and thus the upper layer 702 may not serve as an anode of the galvanic cell.

Figure 11A:
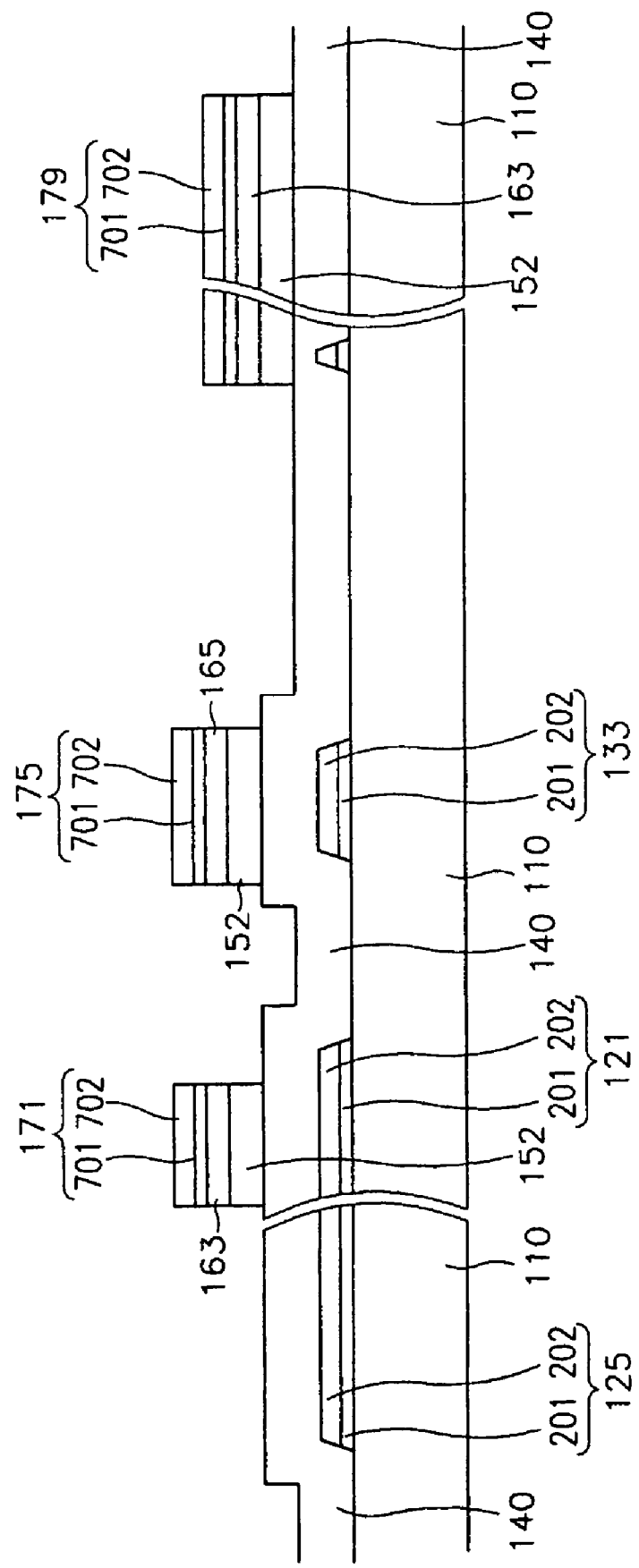
Figure 11B:
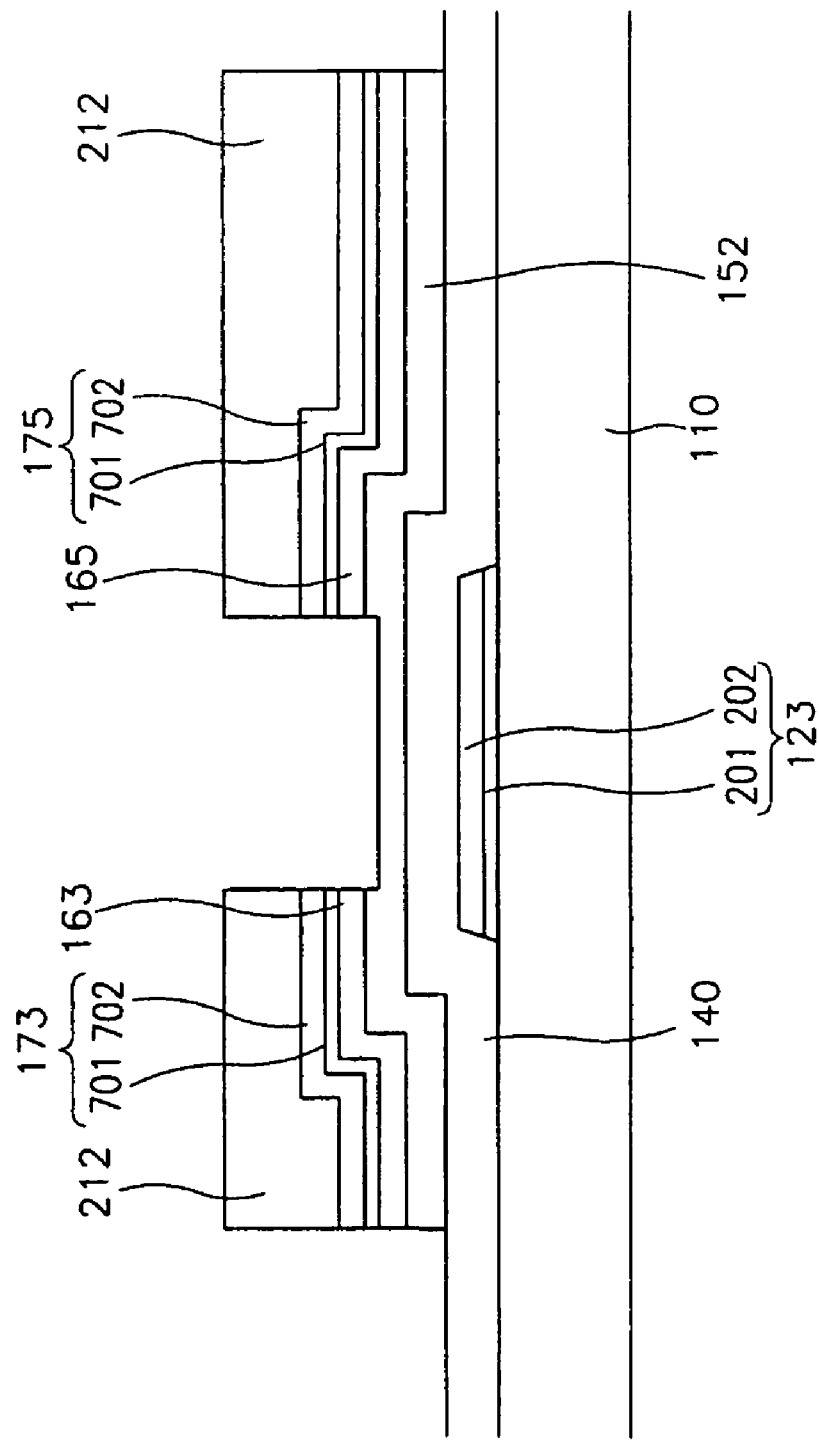
Figure 12A:
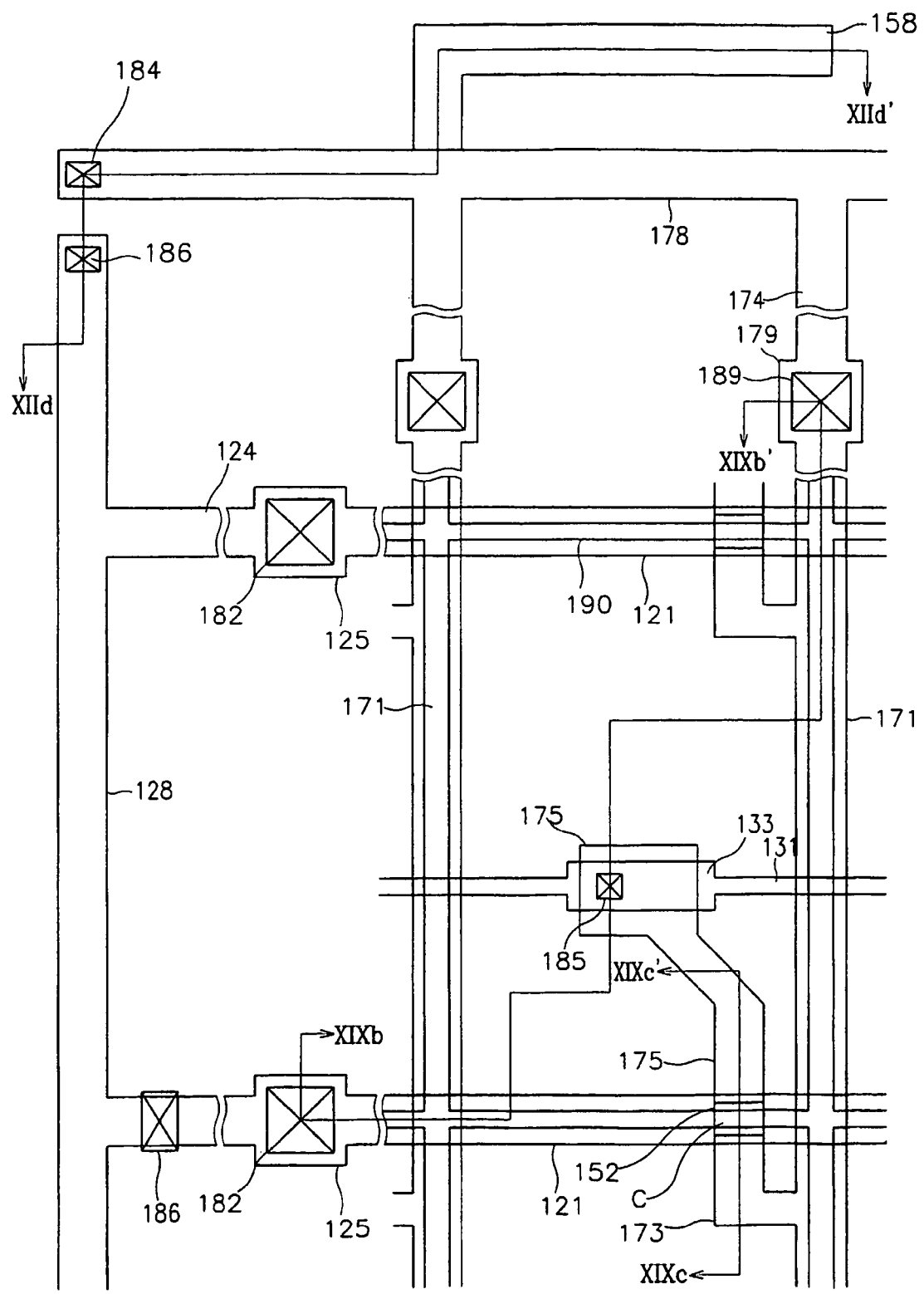
FIG. 12A is a layout view of a TFT array panel in the step following the step shown in FIGS. 11A-11C.
Figure 12B:
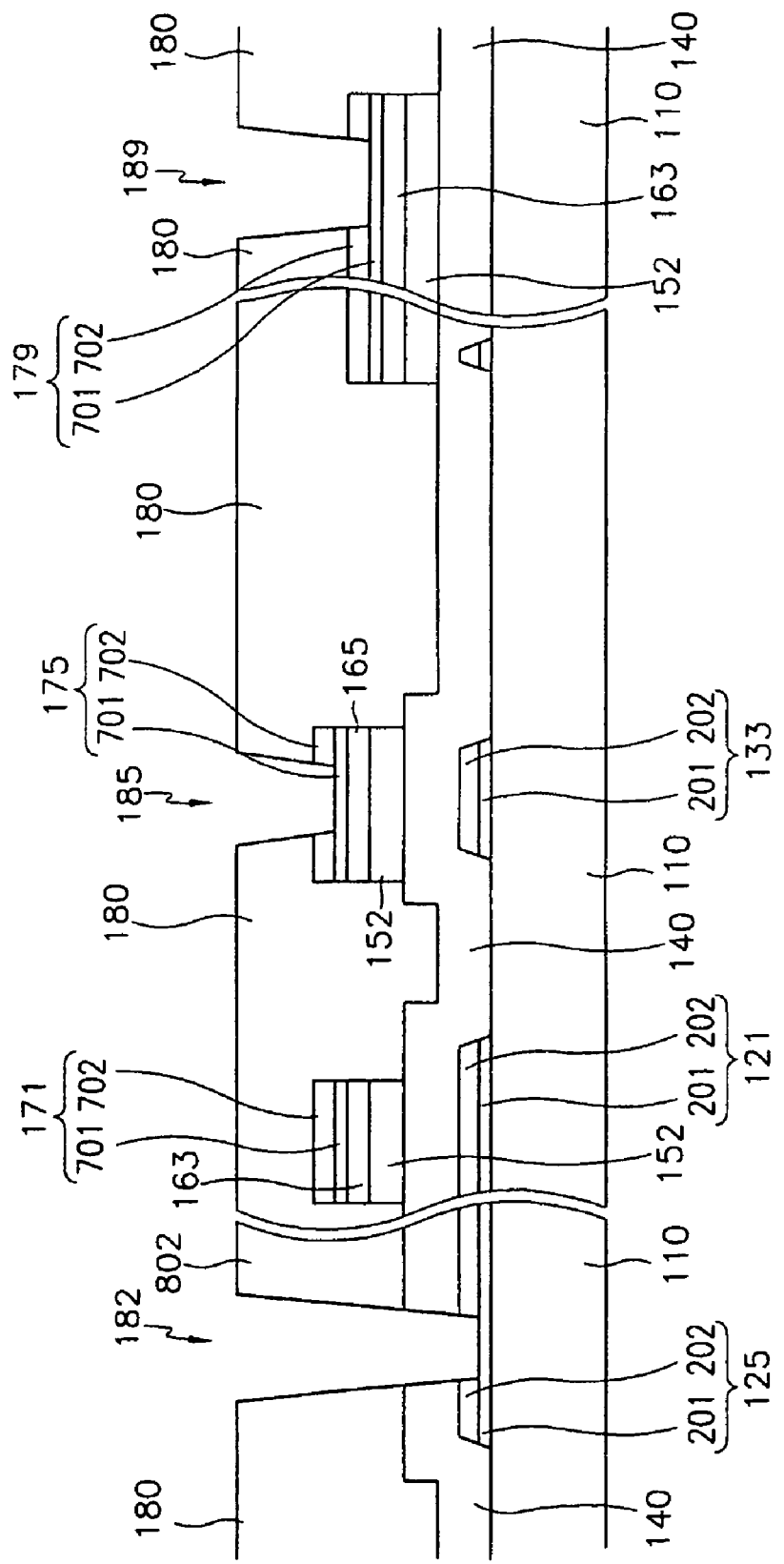
Figure 12D:
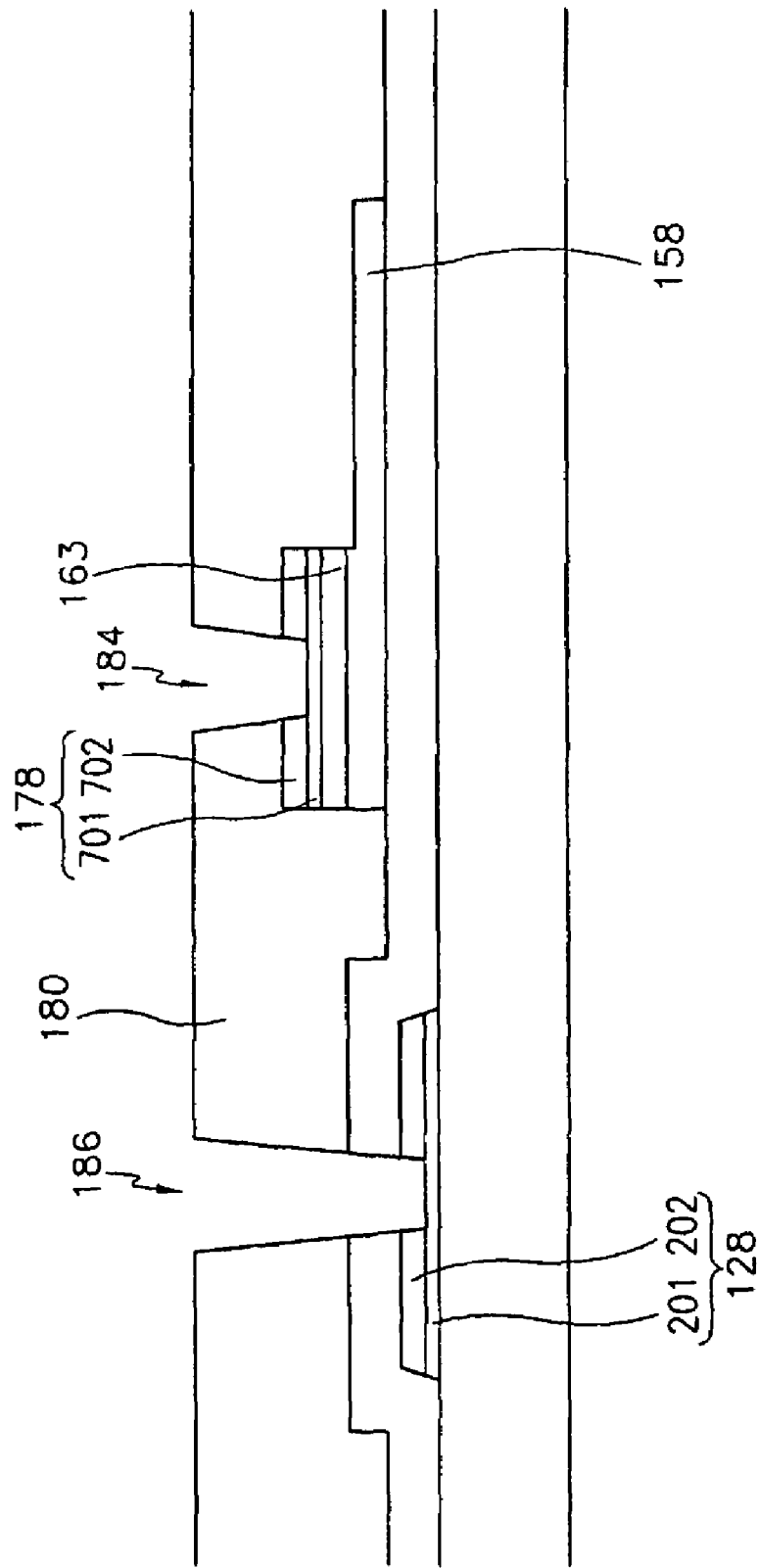

Next, exposed portions of the S/D ohmic contacts 168 are etched to be removed. Here, the etching of both the S/D conductors 176 and the S/D ohmic contacts 168 may be done using only dry etching. Alternatively, the S/D conductors 176 are etched by wet etching and the S/D ohmic contacts 168 are etched by dry etching. In the former case, it is preferable to perform the etching under the condition that etching selectivity between the S/D conductors 176 and the S/D ohmic contacts 168 is high. It is because the low etching selectivity makes the determination of the etching finish point difficult, thereby causing the adjustment of the thickness of the portions of the semiconductor pattern 42 left on the channel areas C to be difficult. Examples of etching gases used for etching the S/D ohmic contacts 168 are a gas mixture of $CF_4$ and HCl and a gas mixture of $CF_4$ and $O_2$. Use of the gas mixture of CF4 and O2 enables to obtain uniform thickness of etched portions of the semiconductor pattern 152. In this regard, as shown in FIG. 11B, the exposed portions of the semiconductor pattern 152 and the etching assistant layer 158 are etched to have a reduced thickness, and the second portions 212 of the photoresist pattern 212 and 214 are also etched to have a reduced thickness. This etching is performed under the condition that the gate insulating layer 140 is not etched, and it is preferable that the photoresist pattern 212 and 214 is thick enough to prevent the second portions 212 from being removed to expose the underlying portions of the data wire 171, 173, 175 and 179 and the second ESD protection wire 174 and 178.

Accordingly, the source electrodes 173 and the drain electrodes 175 are separated from each other, and, simultaneously, the data wire 171, 173, 175 and 179, the second ESD protection wire 174 and 178, and the ohmic contact pattern 163 and 165 thereunder are completed.

Finally, the second portions 212 of the photoresist pattern 212 and 214 left on the wire areas A are removed. Alternatively, the second portions 212 are removed after the portions of the S/D conductors 176 and the etching assistant layer 178 on the channel areas C and the etching assistant areas C' are removed and before the underlying portions of the S/D ohmic contacts 168 are removed. Alternatively, the second portions 212 may be removed after the upper film 702 of the S/D conductors 176 and the etching assistant layer 178 is removed.

After forming the data wire 171, 173, 175 and 179 and the second ESD protection wire 174 and 178, as shown in FIGS. 12A-12D, a protective layer 180 is formed by CVD of silicon nitride, by coating an photosensitive organic insulating material having good planarization characteristics, or by PECVD of low dielectric material such as a-Si:C:O or a-Si:O:F.

The protective layer 180 together with the gate insulating layer 140 is etched to form a plurality of contact holes 182, 189 and 185 exposing the gate pads 125, the data pads 179, and the drain electrodes 175. Consecutively, the portions of the upper films 202 and 702 of Al or Al alloy exposed through the contact holes 182, 185, 184, 186 and 189 are removed by blanket etching with an Al etchant.

Finally, as shown in FIGS. 1-4, an ITO layer or an IZO layer with a thickness of 500-1,000 Å is deposited and photo-etched to form a plurality of pixel electrodes 190 connected to the drain electrodes 175, a plurality of subsidiary gate pads 92 connected to the gate pads 125, a plurality of subsidiary data pads 97 connected to the data pads 179, and an ESD protection connection pattern 96 contacting the lower films 201 and 701 for connecting the gate shorting bar 128 and the data shorting bar 178.

Since the data wire 171, 173, 175 and 179, the ohmic contact pattern 163 and 165 thereunder and the semiconductor pattern 152 thereunder are formed using a single mask, and the source electrode 173 and the drain electrode 175 are separated from each other in this process, the second embodiment of the present invention gives a simple manufacturing method.

What is claimed is:

1. A thin film transistor array panel comprising:
    an insulating substrate;
    a gate wire formed on the substrate and including a plurality of gate lines and a plurality of gate electrodes connected to the gate lines;
    a gate insulating layer formed on the gate line;
    a semiconductor layer formed on the gate insulating layer;
    a data wire formed on the semiconductor layer and including a plurality of data lines intersecting the gate lines, a plurality of source electrodes connected to the data lines, and a plurality of drain electrodes located opposite the source electrodes with respect to the gate electrodes;
    a plurality of pixel electrodes connected to the drain electrodes; and
    an etching assistant pattern made of the same layer as the semiconductor layer and located out of an area enclosed by the gate lines and the data lines.

2. The thin film transistor array panel of claim 1, wherein the data wire comprises a lower film of Cr, Mo or Mo ally and an upper film of Al or Al ally.

3. The thin film transistor array panel of claim 2, further comprising a passivation layer disposed between the data wire and the pixel electrode.

4. The thin film transistor array panel of claim 3, wherein the semiconductor layer has substantially the same planar shape as the data wire except for a channel portion located between the data line and the drain electrode.

5. The thin film transistor array panel of claim 1, wherein the etching assistant pattern is located outside of a pixel area.

6. The thin film transistor array panel of claim 1, wherein the etching assistant pattern is formed directly on the gate insulating layer.

7. The thin film transistor array panel of claim 1, wherein the thickness of the etching assistant pattern is thinner than a thickness of the semiconductor layer.

\* \* \* \* \*

UNITED STATES PATENT AND TRADEMARK OFFICE
CERTIFICATE OF CORRECTION

PATENT NO. : 7,605,416 B2  Page 1 of 1
APPLICATION NO. : 10/531442
DATED : October 20, 2009
INVENTOR(S) : Mun-Pyo Hong et al.

It is certified that error appears in the above-identified patent and that said Letters Patent is hereby corrected as shown below:

The title of the invention item (54) should read "THIN FILM TRANSISTOR ARRAY PANEL AND A METHOD FOR MANUFACTURING THE PANEL"

Signed and Sealed this

First Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,605,416 B2 Page 1 of 1
APPLICATION NO. : 10/531442
DATED : October 20, 2009
INVENTOR(S) : Mun-Pyo Hong et al.

It is certified that error appears in the above-identified patent and that said Letters Patent is hereby corrected as shown below:

Title Page,
The title of the invention item (54) and at column 1, lines 1-3, should read "THIN FILM TRANSISTOR ARRAY PANEL AND A METHOD FOR MANUFACTURING THE PANEL"

This certificate supersedes the Certificate of Correction issued June 1, 2010.

Signed and Sealed this

Twenty-ninth Day of June, 2010

David J. Kappos
*Director of the United States Patent and Trademark Office*